US012737526B1

(12) United States Patent
McCracken et al.

(10) Patent No.: US 12,737,526 B1
(45) Date of Patent: Sep. 15, 2026

(54) INCREMENTAL SYNTHESIS FROM RTL CIRCUIT DESIGNS IN EDA

(71) Applicant: Cadence Design Systems, Inc., San Jose, CA (US)

(72) Inventors: Thaddeus Clay McCracken, Mosier, OR (US); Ankush Sood, Los Gatos, CA (US); Yifeng Wang, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 663 days.

(21) Appl. No.: 18/224,459

(22) Filed: Jul. 20, 2023

Related U.S. Application Data

(60) Provisional application No. 63/521,834, filed on Jun. 19, 2023.

(51) Int. Cl.

| | |
|---|---|
| ***G06F 30/33*** | (2020.01) |
| ***G06F 30/398*** | (2020.01) |
| *G06F 30/323* | (2020.01) |
| *G06F 30/327* | (2020.01) |
| *G06F 30/3323* | (2020.01) |
| *G06F 30/337* | (2020.01) |

(52) U.S. Cl.
CPC ............ *G06F 30/398* (2020.01); *G06F 30/33* (2020.01); *G06F 30/323* (2020.01); *G06F 30/327* (2020.01); *G06F 30/3323* (2020.01); *G06F 30/337* (2020.01)

(58) Field of Classification Search
CPC ...... G06F 30/398; G06F 30/33; G06F 30/323; G06F 30/327; G06F 30/3323; G06F 30/337
See application file for complete search history.

(56) References Cited

U.S. PATENT DOCUMENTS

| | | | | |
|---|---|---|---|---|
| 6,601,024 | B1 * | 7/2003 | Chonnad ............ | G06F 30/3308 716/106 |
| 10,192,013 | B1 * | 1/2019 | Arora ................ | G11C 29/1201 |
| 10,824,783 | B2 * | 11/2020 | Theivendran ......... | G06F 30/327 |

OTHER PUBLICATIONS

Lavagno et al., Incremental High-Level Synthesis, DAC, 2010, pp. 702-706. (Year: 2010).*

* cited by examiner

*Primary Examiner* — Nghia M Doan
(74) *Attorney, Agent, or Firm* — Schwegman Lundberg & Woessner, P.A.

(57) ABSTRACT

A method for incremental synthesis of a changed RTL design. A current RTL design and an implementation of a previous RTL design are processed to generate reuse information identifying one or more reusable design entities of the implementation of the previous register-transfer level design. An implementation of the current RTL design is generated by processing design entities of the current RTL design to generate synthesized logic corresponding to the design entities of the current RTL design, and combining the one or more reusable design entities with the synthesized logic based on the reuse information.

20 Claims, 21 Drawing Sheets

ACCESS CURRENT RTL DESIGN 2102

ACCESS IMPLEMENTATION OF PREVIOUS RTL DESIGN 2104

PROCESS CURRENT RTL DESIGN AND IMPLEMENTATION OF PREVIOUS RTL DESIGN TO GENERATE REUSE INFORMATION IDENTIFYING REUSABLE DESIGN ENTITIES FROM IMPLEMENTATION OF PREVIOUS RTL DESIGN 2106

GENERATE IMPLEMENTATION OF CURRENT RTL DESIGN 2108

PROCESS DESIGN ENTITIES OF CURRENT RTL DESIGN TO GENERATE SYNTHESIZED LOGIC 2110

COMBINE THE REUSABLE DESIGN ENTITIES WITH THE SYNTHESIZED LOGIC BASED ON THE REUSE INFORMATION 2112

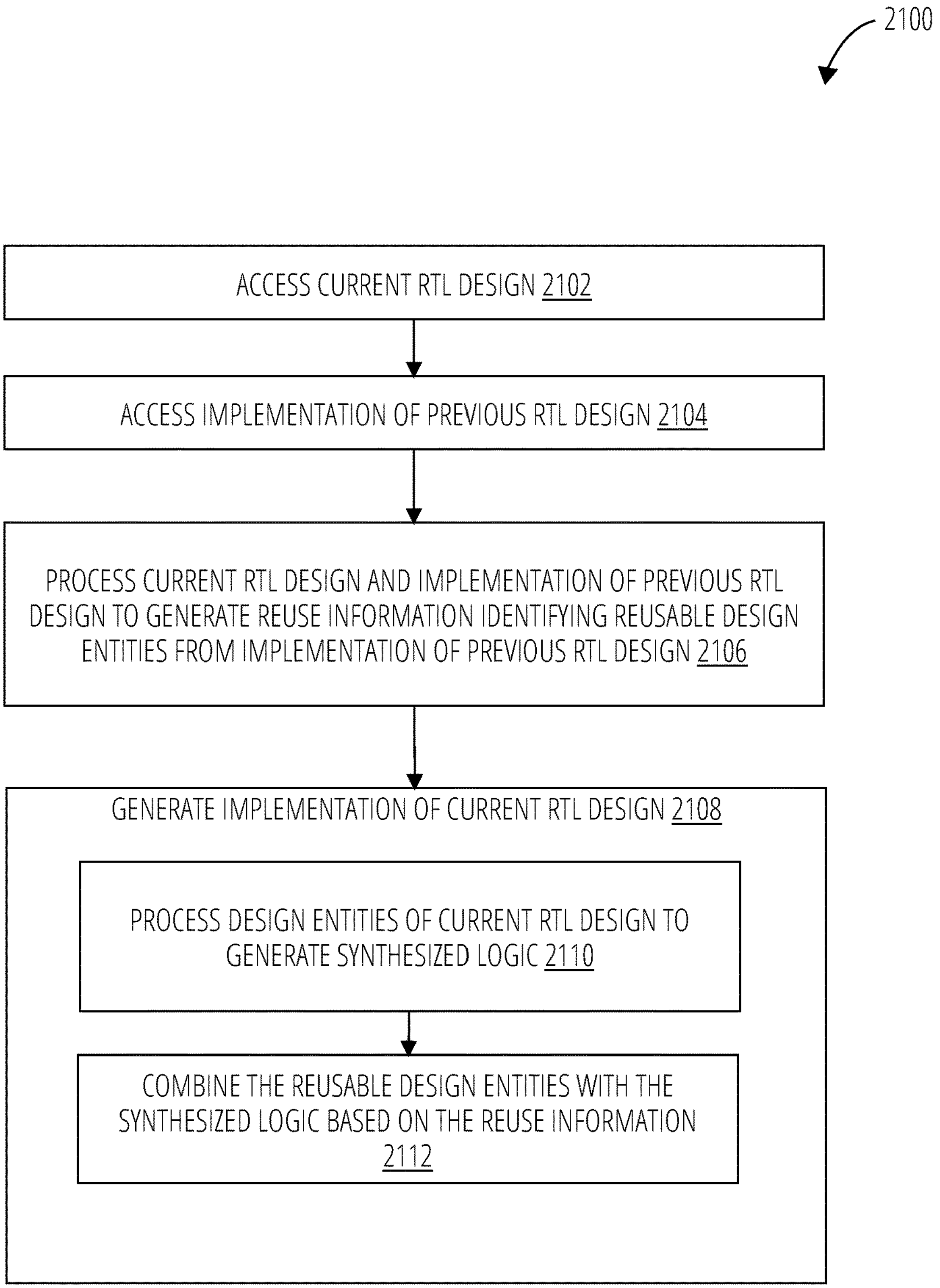

FIG. 21

INCREMENTAL SYNTHESIS FROM RTL CIRCUIT DESIGNS IN EDA

CLAIM OF PRIORITY

This application claims the benefit of priority under 35 U.S.C. § 119(e) to U.S. Provisional Patent Application Ser. No. 63/521,834, filed on Jun. 19, 2023, which is incorporated by reference herein in its entirety.

TECHNICAL FIELD

The present disclosure generally relates to the technical field of circuit design. In particular, the present disclosure relates to incremental synthesis of circuit designs from register-transfer level (RTL) circuit designs in electronic design automation (EDA) systems used for designing circuits.

BACKGROUND

During the electronic circuit design process, using an electronic design automation (EDA) system to design an integrated circuit (IC) or other circuit, a circuit designer generates a register-transfer level (RTL) design. An RTL design is a design at a high level of abstraction. It models a circuit in terms of the flow of signals (e.g., data) between hardware registers (each register roughly corresponding to a logical variable), and the logical operations performed on those signals. Hardware description languages (HDLs), such as Verilog, System Verilog, and Very High Speed Integrated Circuit (VHSIC) Hardware Description Language (VHDL) can be used to generate the RTL design. The RTL design provides a high-level representation of the circuit from which lower-level circuit representations and actual circuit wiring can be derived, for example, by the use of synthesis software tools such as HDL compiler software, which can compile an RTL design defined in an HDL to generate a lower-level circuit representation.

BRIEF DESCRIPTION OF THE SEVERAL VIEWS OF THE DRAWINGS

In the drawings, which are not necessarily drawn to scale, like numerals may describe similar components in different views. To easily identify the discussion of any particular element or act, the most significant digit or digits in a reference number refer to the figure number in which that element is first introduced. Some non-limiting examples are illustrated in the figures of the accompanying drawings in which:

FIG. 21 illustrates a flowchart showing operations of a method for performing incremental synthesis, according to some examples.

DETAILED DESCRIPTION

Figure 1:
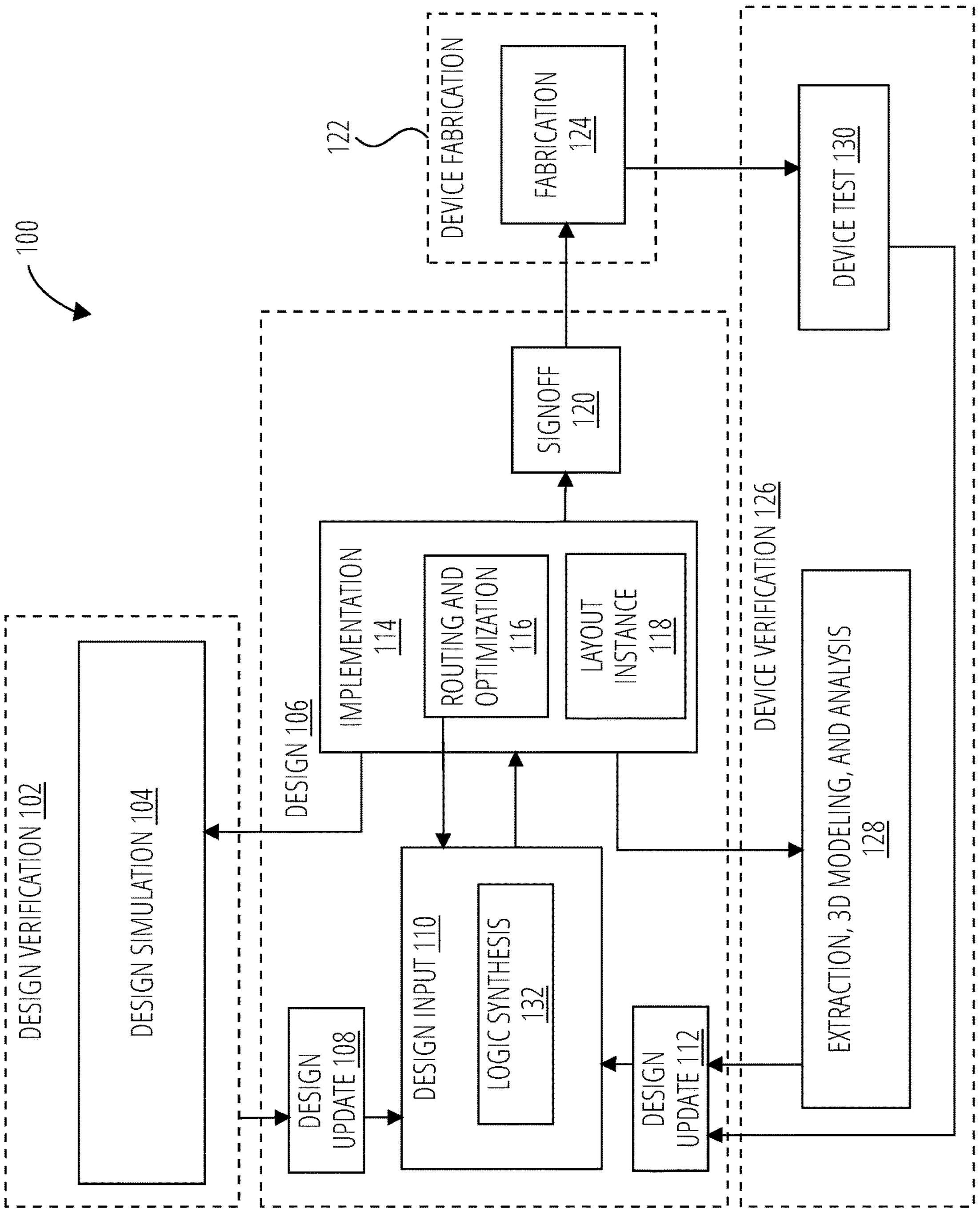
FIG. 1 illustrates an example design process flow for circuit design, according to some examples.

Examples described herein may provide methods, systems, and computer readable media for incremental synthesis of a circuit representation based on changes to an RTL design.

Circuit designers using EDA systems typically make repeated changes to the RTL design of a circuit, executing a logic synthesis operation after each set of RTL changes to measure the effects of the RTL changes on design goals or requirements, such as the impact of the RTL changes on the power, performance, and/or area (PPA) of the circuit. This iterative repetition of RTL changes and re-synthesis is particularly common during the early stages of RTL development, when designers often change the RTL design in order to improve PPA. However, this iterative cycle may also occur later in the design process, in order to fix functional bugs in the circuit design.

In existing EDA systems, each iteration of this cycle requires that the lower-level circuit representation must be re-synthesized by executing a full synthesis operation to synthesize the lower-level representation of the entire circuit design from the entire RTL design. The large block sizes used in many circuit designs can result in long runtimes for the synthesis operation, potentially compounded by long runtimes for placing and routing operations. For example, a modern circuit design can include many millions of synthesized, placed and routed gates. In some cases, a full circuit design process, including synthesis, placement and routing, and formal verification, can take a week or longer. Even a small RTL change (such as might be required to address a functional failure, or a PPA issue) may require a full re-iteration of an entire implementation process for the circuit design. When this happens late in the development cycle, the time required to reiterate the implementation process can delay production of the physical circuit product. In addition, in some circumstances, a small RTL change intended to address a localized PPA issue can, when re-synthesized and propagated through the entire implementation process, perturb the overall circuit design in such a way that flow noise and variation prevents convergence to a desired PPA result for the implemented circuit design.

Examples described herein may provide automatic incremental synthesis and implementation techniques for EDA. An example use case will be described. During a circuit design process flow, a first iteration of a design process may yield a first version of an RTL design, denoted "N" (also called the "previous RTL design"). A second, subsequent iteration of the design process yields a second version of the RTL design, denoted "N+1" (also called the "current RTL design"). N+1 differs from N insofar as some RTL changes have been made to version N of the RTL design, e.g., RTL changes made to address a functional or performance issue. In the example use case, the designer has executed a logic synthesis process to generate a lower-level circuit representation (e.g., a netlist) based on RTL design version N, and this lower-level circuit representation has proceeded through an entire iteration of the implementation process. The designer has now created version N+1 of the RTL design and wishes to implement a further lower-level circuit representation of N+1, in as little time as possible, and with as little perturbance of the functional operation and/or PPA of version N, as possible. Some examples described herein may provide techniques for generating and implementing a lower-level circuit representation of N+1 that satisfies one or more of the designer's goals.

In various examples described herein, a lower-level circuit representation of N+1 may be generated without requiring full logic synthesis of the entire N+1 RTL design. Instead, a cached copy of the implemented, lower-level representation RTL design version N (also referred to as the "cached copy of N", the "implementation of N", the "N implementation", the "implementation of the previous register-transfer level design", or the "implementation of the previous RTL design") may be combined with RTL design version N+1 to generate and implement the lower-level circuit representation of N+1 (also referred to as the "implementation of N+1", "the N+1 implementation", the "representation of N+1", the "N+1 representation", the "implementation of the current previous register-transfer level design", or "the implementation of the current RTL design"). In some examples, the implementation of an RTL design of a circuit may include a setlist of mapped gates which may be technology-specific. In some examples, the implementation may include gates that are mapped, placed, and/or routed. In some examples, the implementation of N+1 is synthesized using a technique referred to herein as incremental synthesis. In incremental synthesis, the inputs (cached implementation of N, RTL design version N+1) are analyzed to determine which parts of the cached implementation of N can be safely re-used in the N+1 implementation. Then, only the parts of RTL version N+1 that cannot be safely re-used are re-synthesized, and the result is combined with the safe portions of the cached implementation of N to generate the implementation of N+1.

By avoiding the need to re-synthesize the entire representation of N+1 and/or to re-implement the re-synthesized representation of N+1, some examples described herein attempt to address one or more technical problems relating to circuit design using EDA. In some examples, computing resources such as processor cycles, power, heat dissipation, and time may be conserved by shortening and simplifying the logic synthesis operations performed by an EDA system in each iteration of the RTL design, synthesis, and implementation cycle. In some examples, a design process flow can be shortened, allowing more rapid iteration of design changes and potentially achieving greater performance and/or lower resource consumption (e.g., power, heat dissipation, area) in the final product due to the ability to perform more rapid design iterations within a product development timeframe. In some examples, shortening the design process flow can avoid wasting resources due to missed production deadlines or otherwise wasted due to process dependencies being halted while waiting for one or more iterations of RTL changes, synthesis, and implementation are completed.

In some examples, incremental synthesis may provide an accurate prediction of PPA outcomes for a circuit implementation based on a new version of an RTL design. This may allow RTL and incremental synthesis to be performed without the need to re-implement the new design in order to determine the impact of design changes on PPA, further conserving computational resources and/or shortening the iterative design cycle.

Existing approaches to partial re-synthesis typically require manual combination of the new RTL design with a netlist synthesized based on the old design, and/or are limited to extremely simple RTL changes that can be defined and implemented as logic gate-level engineering change order (ECO) modifications. Manual approaches tend to be error-prone and require large amounts of work to be performed by a human designer. Existing automated approaches, because they attempt to define the changes using ECO at the level of logic gates, cannot meaningfully handle changes that attempts to address PPA problems, no can they predict or guarantee that a change will not have an adverse effect on PPA. Thus, examples described herein may further attempt to address one or more of the technical problems defined by the limitations of existing approaches described above. In some examples, an automated technique for incremental synthesis is provided that reduces the need for human oversight and avoids human error. In some examples, incremental synthesis techniques are provided that enable incremental synthesis of RTL changes addressing PPA problems, and/or enable the prediction of PPA effects of the RTL changes.

In some examples, the techniques described herein can be used to analyze a fully implemented version of an RTL design (e.g., an implementation of RTL design version N) against a new version of the RTL design (e.g., RTL design version N+1), and to automatically determine which portion of the RTL design have changed, and which have not changed, between version N and version N+1. In addition, this analysis may be able to determine which portions of the implementation of version N can be reused in the implementation of version N+1, while maintaining formal verification correctness against RTL design version N+1.

In identifying which portions of the implementation of version N can be reused, some examples may perform one or more of the following types of analysis. First, a content match check may be performed to determine of the two RTL designs satisfy a content matching condition. This content matching condition may not be satisfied if, for example, a meaningful RTL change (e.g., not simply a change in whitespace characters, file name, or comments) has occurred between versions N and N+1. The reuse analysis may also determine where such changes have occurred, in order to determine which design entities (e.g., modules or other circuit components) satisfy the content matching condition and which do not.

Second, the reuse analysis may factor in complex boundary optimization operations that were performed during the implementation of version N, and how those might affect the ability to reuse a portion of the implementation of version N. Such boundary optimizations may include operations such as pushing of constants across hierarchical boundaries, merging of functionally identical ports as a synthesis optimization, retiming across hierarchical boundaries, hierarchical clock gating, etc. The presence of certain types of boundary optimizations may prevent a design entity from being reusable if the design entity fails to satisfy a boundary optimization condition as part of a boundary change check operation.

The outcomes of the content match check and boundary change check on a given design entity may be propagated upward through parent design entities and downward through child design entities of the RTL design, according to hierarchical relationships between the design entities. In a hierarchical circuit design, the different parts of the circuit may be grouped into functional blocks, and buses may be used to keep track of all the relevant inputs and outputs to a given functional block. Circuit schematics are nested in some hierarchical designs, maintaining a parent-child relationship between different parts of the circuit and facilitating the tracing of logical flows through the circuit design. If a given design entity has a certain pattern of hierarchical relationships to other design entities that fail to satisfy the content matching condition and/or the boundary optimization condition, the given design entity may fail to satisfy a hierarchical boundary condition and be deemed non-reusable.

Some examples described herein may enable the incremental addition, removal, and/or adjustment of structures used for design for testing (DFT). For example, DFT structures can be incrementally added to an existing implementation of previous version N of the RTL design in order to enable testing of various subsystems as needed.

Thus, in some examples, the techniques described herein may provide means to programmatically detect meaningful RTL changes, including those that occur in the instantiation of heavily parameterized RTL module descriptions. Some examples may also provide means to keep track of, and then compare, boundary optimizations that are performed on any given design entity, so that such information can be used when determining the reusability of a fully implemented version N of that design entity in a new (version N+1) context. Some examples may provide a reuse determination method or algorithm that factors RTL change information, boundary optimization analysis, and analysis of design hierarchical relationships to determine which portions of a previously implemented (version N) design can be reused in a new (version N+1) design, without sacrificing design functional correctness. Some examples may provide flow requirements and enhancements necessary to achieve runtime and convergence improvements when reusing large portions of a previous implementation of an RTL design; flow requirements to extend such a reuse flow into reusing a fully placed and routed implementation, including mixing reuse of some of a fully placed and routed implementation with portions of a new implementation; and/or requirements to incrementally stitch design for testing (DFT) structures into version N+1 of the RTL design, while re-using as much of the existing DFT structure as possible from the fully implemented version N of the RTL design.

Other technical features may be readily apparent to one skilled in the art from the following figures, descriptions, and claims.

FIG. 1 is a diagram illustrating an example design process flow 100 for generating a circuit design, according to some embodiments. As shown, the design process flow 100 includes a design phase 106, a device fabrication phase 122, a design verification phase 102, and a device verification phase 126. The design phase 106 involves an initial design input 110 operation where the basic elements and functionality of a device are determined, and revisions are made based on various analyses and optimization of a circuit design. This design input 110 operation is where block instances are used in the circuit design and any additional circuitry for the design around the blocks is selected. The initial strategy, tactics, and context for the device to be created are also generated in the design input 110 operation, depending on the particular design algorithm to be used.

In some embodiments, following an initial selection of design values in the design input 110 operation, routing, timing analysis, and optimization are performed in an implementation operation 114, which includes an optimization 116 operation and generating a layout instance 118, along with any other automated design processes. Optimization 116 may occur prior to the layout instance 118, and routing, timing analysis, and optimization 116 may be performed at any time to verify operation of a circuit design. For instance, in various embodiments, timing analysis in a circuit design may be performed prior to routing of connections in the circuit design, after routing, during register transfer level (RTL) operations, or as part of a signoff 120.

Though not shown, the routing and optimization 116 operation can include a clock tree synthesis (CTS) operation, which can generate one or more clock trees that deliver clock signal from clock sources of a circuit design to a plurality of clock tree leaf nodes comprising clock tree sinks (e.g., flip-flops) within the circuit design. The routing and optimization 116 operation may also include other operations not shown, such as those relating to floorplanning, placement, post-placement optimization, and post-routing optimization.

Design inputs are used in the design input 110 operation. In some examples, the design inputs may include RTL design data, such as hardware description language (HDL) data. The design inputs may also include other data, such as timing constraints, technology libraries, floorplan data, expression of power intent, etc. These design inputs (e.g., an RTL design and/or other design input data) may be further processed during the design input 110 operation via a logic synthesis operation 132 to generate a lower-level circuit representation, such as a circuit netlist mapped to a target standard library manufacturable by the foundry in fabrication operation 124. Examples described herein may provide logic synthesis operations 132 configured to perform incremental synthesis during the iterative design process flow 100 shown in FIG. 1.

The netlist generated by logic synthesis operation 132 is placed by the layout instance 118 and optimized and routed by operation 116, and a clock tree is inserted by a CTS process. Operations 116 and 118 may have a close interrelation and may be simultaneously optimized by processes similar to CCOPT. Prior to the routed, placed and optimized netlist being provided to a fabrication operation 124, the signoff 120 is performed on the circuit design defined by the layout.

In some examples, an implementation of a current version of the circuit design, such as layout instance 118, may be provided to the logic synthesis operation 132, where it is cached and used to perform incremental synthesis of the next iteration of the circuit design, as described in greater detail below. Thus, a layout instance 118 or other implementation of design version N may be cached by logic synthesis operation 132, and the logic synthesis operation 132 may subsequently combine this cached implementation of N with a further RTL design N+1 received as design inputs such as HDL data in order to perform incremental synthesis to generate a further implementation of design version N+1. In some examples, one or more operations performed as part of incremental synthesis may be performed by other components shown in the design process flow 100, such as implementation operation 114.

After signoff verification by the signoff 120, a verified version of the layout is used in the fabrication operation 124 to generate a device, or additional testing and design updates may be performed using designer inputs or automated updates based on design simulation 104 operations or extraction, 3D modeling, and analysis 128 operations. Once the device is generated, the device can be tested as part of device test 130 operations, and layout modifications generated based on actual device performance.

As described in more detail below, a design update 108 from the design simulation 104; a design update 108 from the device test 130 or the extraction, 3D modeling, and analysis 128 operations; or from the design input 110 operation may occur after the initial layout instance 118 is generated. In various embodiments, whenever design inputs are used to update or change an aspect of a circuit design, a timing analysis and the routing and optimization 116 operation may be performed.

Machine Architecture

Figure 2:
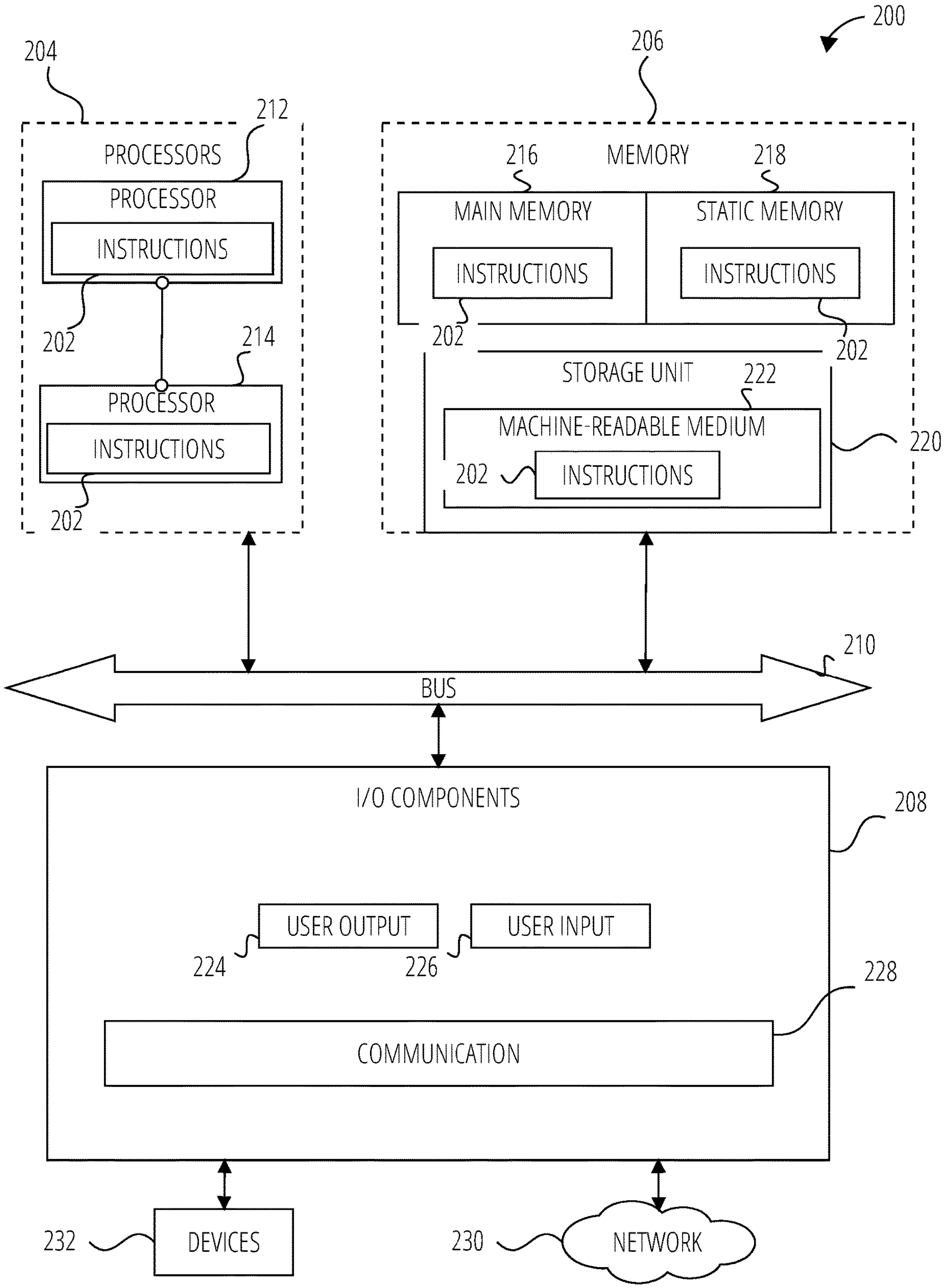
FIG. 2 is a diagrammatic representation of a machine in the form of a computer system within which a set of instructions may be executed to cause the machine to perform any one or more of the methodologies discussed herein, according to some examples.

FIG. 2 is a diagrammatic representation of the machine 200 within which instructions 202 (e.g., software, a program, an application, an applet, an app, or other executable code) for causing the machine 200 to perform any one or more of the methodologies discussed herein may be executed. For example, the instructions 202 may cause the machine 200 to execute any one or more of the methods described herein. The instructions 202 transform the general, non-programmed machine 200 into a particular machine 200 programmed to carry out the described and illustrated functions in the manner described. The machine 200 may operate as a standalone device or may be coupled (e.g., networked) to other machines. In a networked deployment, the machine 200 may operate in the capacity of a server machine or a client machine in a server-client network environment, or as a peer machine in a peer-to-peer (or distributed) network environment. The machine 200 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 202, sequentially or otherwise, that specify actions to be taken by the machine 200. Further, while a single machine 200 is illustrated, the term "machine" shall also be taken to include a collection of machines that individually or jointly execute the instructions 202 to perform any one or more of the methodologies discussed herein. In some examples, the machine 200 may comprise both client and server systems, with certain operations of a particular method or algorithm being performed on the server-side and with certain operations of the particular method or algorithm being performed on the client-side.

The machine 200 may include processors 204, memory 206, and input/output I/O components 208, which may be configured to communicate with each other via a bus 210. In an example, the processors 204 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 212 and a processor 214 that execute the instructions 202. The term "processor" is intended to include multi-core processors that may comprise two or more independent processors (sometimes referred to as "cores") that may execute instructions contemporaneously. Although FIG. 2 shows multiple processors 204, the machine 200 may include a single processor with a single core, a single processor with multiple cores (e.g., a multi-core processor), multiple processors with a single core, multiple processors with multiples cores, or any combination thereof.

The memory 206 includes a main memory 216, a static memory 218, and a storage unit 220, both accessible to the processors 204 via the bus 210. The main memory 206, the static memory 218, and storage unit 220 store the instructions 202 embodying any one or more of the methodologies or functions described herein. The instructions 202 may also reside, completely or partially, within the main memory 216, within the static memory 218, within machine-readable medium 222 within the storage unit 220, within at least one of the processors 204 (e.g., within the processor's cache memory), or any suitable combination thereof, during execution thereof by the machine 200.

The I/O components 208 may include a wide variety of components to receive input, provide output, produce output, transmit information, exchange information, capture measurements, and so on. The specific I/O components 208 that are included in a particular machine will depend on the type of machine. For example, portable machines such as mobile phones may include a touch input device or other such input mechanisms, while a headless server machine will likely not include such a touch input device. It will be appreciated that the I/O components 208 may include many other components that are not shown in FIG. 2. In various examples, the I/O components 208 may include user output components 224 and user input components 226. The user output components 224 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 226 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

Communication may be implemented using a wide variety of technologies. The I/O components 208 further include communication components 228 operable to couple the machine 200 to a network 230 or devices 232 via respective coupling or connections. For example, the communication components 228 may include a network interface component or another suitable device to interface with the network 230. In further examples, the communication components 228 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 232 may be another machine or any of a wide variety of peripheral devices (e.g., a peripheral device coupled via a USB).

Moreover, the communication components 228 may detect identifiers or include components operable to detect identifiers. For example, the communication components 228 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph™, MaxiCode, PDF417, Ultra Code, UCC RSS-2D bar code, and other optical codes), or acoustic detection components (e.g., microphones to identify tagged audio signals). In addition, a variety of information may be derived via the communication components 228, such as location via Internet Protocol (IP) geolocation, location via Wi-Fi® signal triangulation, location via detecting an NFC beacon signal that may indicate a particular location, and so forth.

The various memories (e.g., main memory 216, static memory 218, and memory of the processors 204) and storage unit 220 may store one or more sets of instructions and data structures (e.g., software) embodying or used by any one or more of the methodologies or functions described herein. These instructions (e.g., the instructions 202), when executed by processors 204, cause various operations to implement the disclosed examples.

The instructions 202 may be transmitted or received over the network 230, using a transmission medium, via a network interface device (e.g., a network interface component included in the communication components 228) and using any one of several well-known transfer protocols (e.g., hypertext transfer protocol (HTTP)). Similarly, the instructions 202 may be transmitted or received using a transmission medium via a coupling (e.g., a peer-to-peer coupling) to the devices 232.

Figure 3:
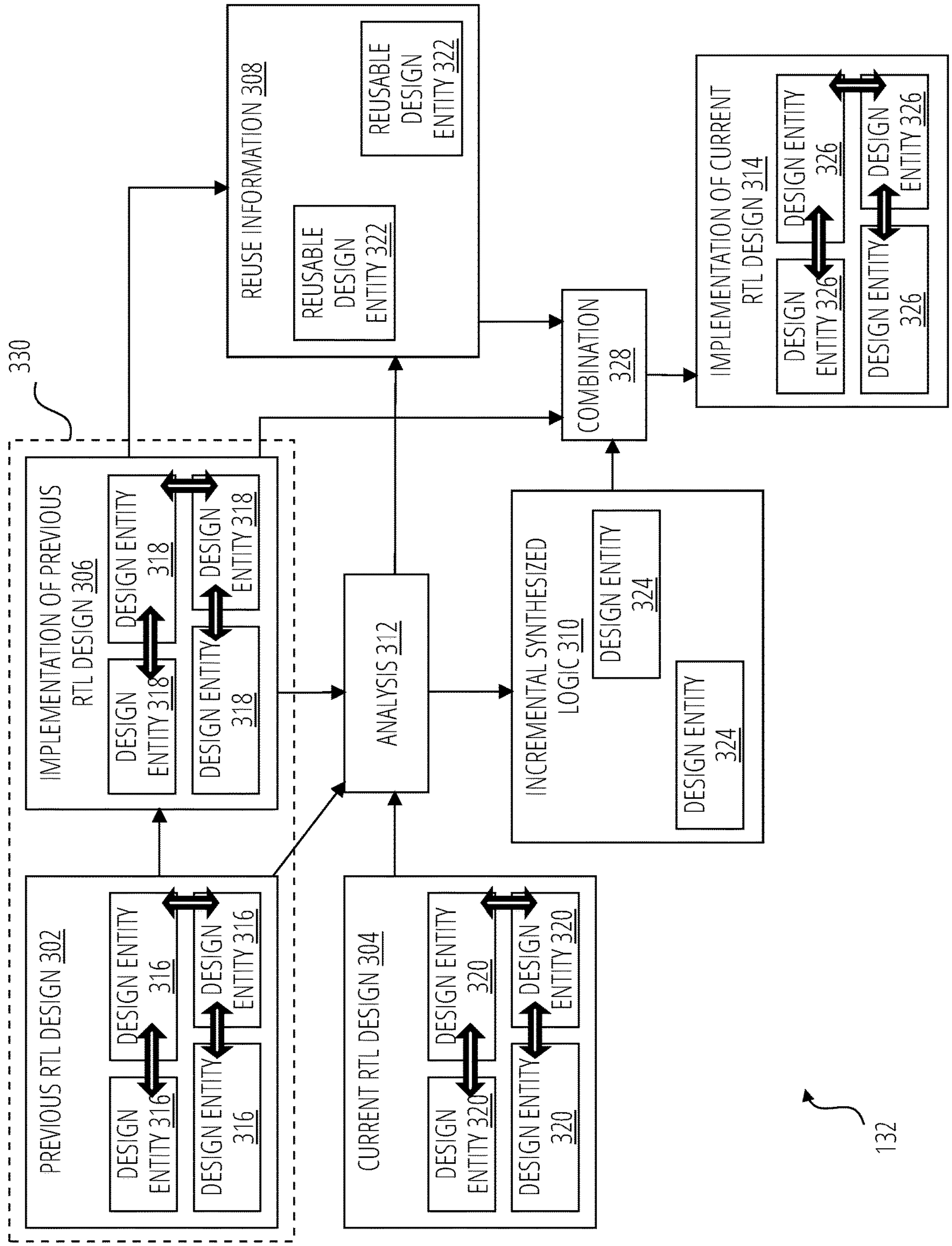
FIG. 3 illustrates a schematic diagram of operations of a logic synthesis module configured to perform incremental synthesis, according to some examples.

FIG. 3 illustrates a schematic diagram of operations of a logic synthesis module configured to perform incremental synthesis (e.g., as part of logic synthesis operation 132), in accordance with some examples described herein. In some examples, the operations shown in FIG. 3 are performed by the logic synthesis operation 132 and/or other operations, processes, or functional modules of the design process flow 100 of FIG. 1, such as implementation operation 114.

The logic synthesis operation 132 performs incremental synthesis by combining portions of a previous RTL design 302, stored in a cache 330 as an implementation of previous RTL design 306, with incremental synthesized logic 310 corresponding to changed portions of a current RTL design 304. In some examples, the implementation of previous RTL design 306 may be generated by the implementation operation 114, after which it is stored in the cache 330.

The previous RTL design 302 (e.g., RTL design version N) includes multiple design entities 316, such as circuit modules, defined at a register-transfer level. The various design entities 316 may have specific relationships with each other, including hierarchical relationships: for example, a first design entity 316 may be a parent or a child of a second design entity 316, such that the child is nested within the parent.

The implementation of previous RTL design 306 represents a lower-level representation of the previous RTL design 302 after it has been implemented by an implementation process (such as implementation operation 114). The implementation of previous RTL design 306 includes the same design entities 316 as previous RTL design 302, shown here as implemented design entity 318 (e.g., the design entities 316 of previous RTL design 302 defined at an implementation level). The implementation of previous RTL design 306 is stored in a cache 330, such as a memory cache (e.g., part of memory 206 of machine 200) accessible by the logic synthesis operation 132. In some examples, the implementation of previous RTL design 306 is stored on-disk (e.g., in storage unit 220), from which it is retrieved and read into the cache 330 (e.g., in memory 206) prior to, or as part of, the incremental synthesis operations described herein. In some examples, all or part of the previous RTL design 302 may also be stored in the cache 330 and used in the incremental synthesis techniques described herein.

The current RTL design 304 (e.g., RTL design version N+1) is the previous RTL design 302 with one or more RTL changes. For example, a designer may have changed portions of the HDL code defining the RTL design. The current RTL design 304 includes multiple design entities 320, which may be the same design entities 316 as the previous RTL design 302, or may include more or fewer design entities, depending on the RTL changes made between the previous version N and the current version N+1. Furthermore, the relationships between any subset of design entities 320 may be the same or different from those between the corresponding subset of design entities 316 of the previous RTL design 302, again depending on the specific RTL changes that have been made.

An analysis operation 312 is performed to analyze the cached implementation of previous RTL design 306 and the current RTL design 304. The analysis operation 312 may make one or more determinations regarding the implementation of previous RTL design 306 and current RTL design 304 that can be used in further EDA operations, such as incremental synthesis. Details of the operation of an example analysis operation 312 are described below with reference to FIG. 4.

The analysis operation 312 generates one or more outputs, including reuse information 308 identifying one or more of the design entities 318 of the implementation of previous RTL design 306 as reusable design entities 322. This identification of reusable design entities 322 may be performed in accordance with various techniques, including those described below with reference to FIG. 4. In some examples, the reuse information 308 may also include hierarchy information (not shown) representative of one or more parent-child relationships between the design entities 316 of the previous RTL design 302. In some examples, the reuse information 308 may also include boundary optimization information (not shown) identifying one or more boundary changes between the previous RTL design 302 and the current RTL design 304.

The analysis operation 312 may also include or communicate with an incremental synthesis operation that synthesizes, in the context of the implementation of previous RTL design 306, incremental synthesized logic 310 including one or more design entities 324 corresponding to design entities 320 of the current RTL design 304. Thus, the reusable design entities 322 identified by the reuse information 308 provide the fully-implemented, lower-level context for incremental synthesis of the design entities 324 of the incremental synthesized logic 310.

A combination operation 328 is then performed to assemble or otherwise combine the incremental synthesized logic 310 with the reusable design entities 322 to generate an implementation of current RTL design 314, without needing to re-synthesize and re-implement the entire current RTL design 304. The implementation of current RTL design 314 includes design entities 326, each of which may be reused from the implementation of previous RTL design 306, synthesized as part of the incremental synthesized logic 310, and/or some combination thereof. Thus, the design entities 326 of the implementation of current RTL design 314 may include a mix of reusable design entities 322 retrieved from the cache 330 and design entities 324 generated by incremental synthesis. In some examples, the implementation of previous RTL design 306 is also provided as an input to the combination operation 328, and the reuse information 308 provides guidance to the combination operation 328 to assemble the incremental synthesized logic 310 into the implementation of previous RTL design 306, replacing those portions of the implementation of previous RTL design 306 that are not reusable (e.g., are not reusable design entities 322).

Figure 4:
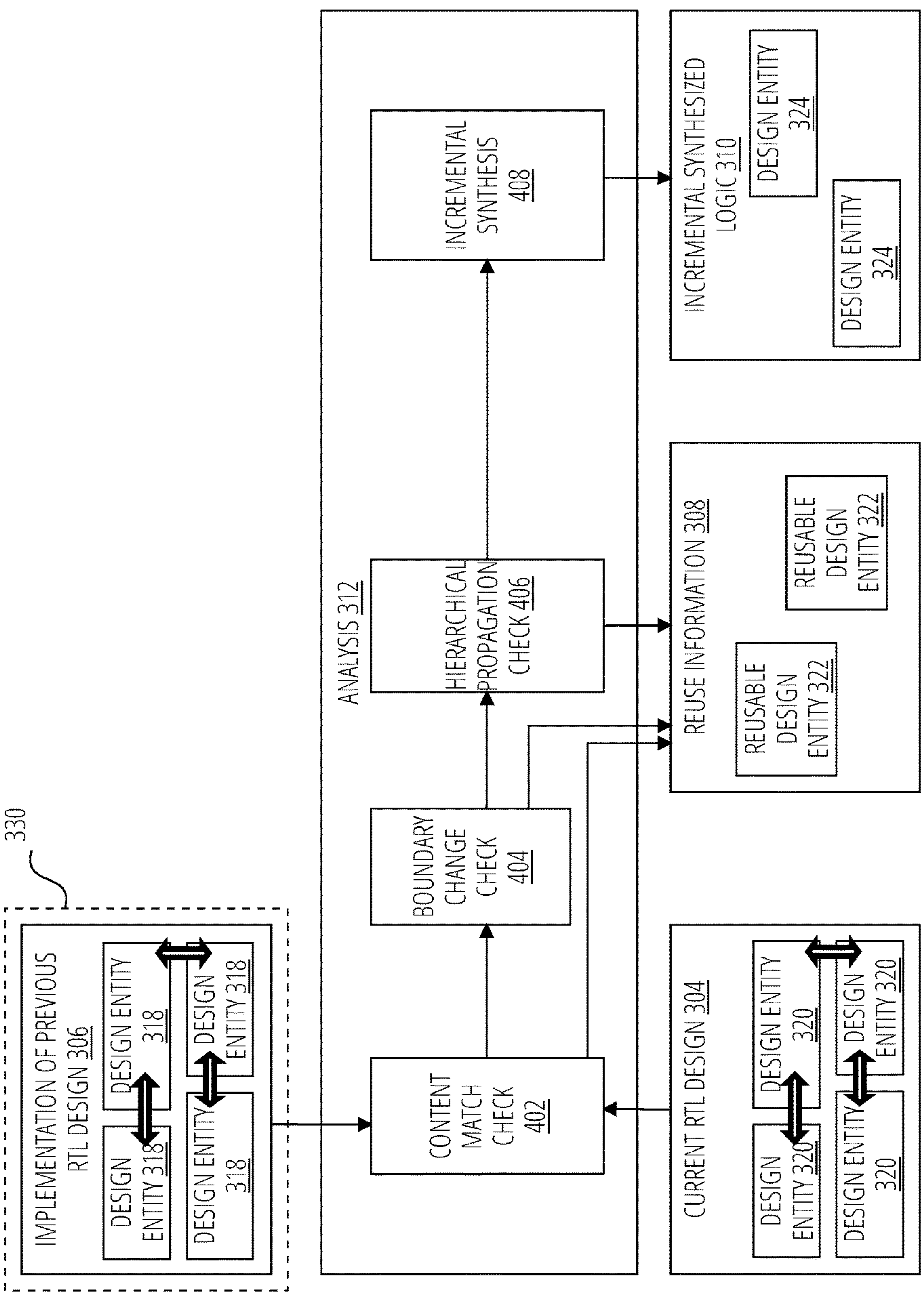
FIG. 4 illustrates a schematic diagram of the operations of the analysis module of FIG. 3, according to some examples.

FIG. 4 shows a schematic diagram of the internal operations of the analysis operation 312 of FIG. 3.

First, a content match check 402 is performed on the design entities 316 of the previous RTL design 302 and their corresponding counterpart design entity 320 of the current RTL design 304. The content match check 402 is intended to identify which design entities (e.g., which modules, or which hierarchical structures) have had meaningful RTL changes between the previous RTL design 302 and the current RTL design 304. A meaningful RTL change refers to a change to the RTL design (e.g., a change to the HDL code) that affects the functional or structural attributed of the circuit being designed. Thus, changes to the HDL code that consist of whitespace characters, comments, or metadata such as file names may not constitute meaningful RTL changes, and may not cause the content match check 402 to return a negative result, in some examples.

In some examples, the implementation of previous RTL design 306 may be provided as an input to the analysis operation 312, in addition to or in place of the previous RTL design 302, for at least the purpose of performing the content match check 402. The operations of an example content match check 402 are described in reference to FIG. 5 below.

Design entities of the implementation of previous RTL design 306 that satisfy the content matching condition checked by the content match check 402 are considered to be potentially reusable. The content matching condition may indicate that the changes to the RTL design between the previous RTL design 302 and the current RTL design 304 do not include any changes to functionality at the RTL level.

Second, a boundary change check 404 is performed to detect boundary optimization operations that have been performed on the various design entities during implementation, thereby potentially resulting in boundary changes that render the design entity non-reusable.

In some examples, the boundary change check 404 checks for boundary changes in a specific order configured to recognize constants across boundaries early in the boundary change check 404 process. If constants are not recognized early, false mismatches may be found in the netlist structures of the design entities 318 of the implementation of previous RTL design 306, which could result in improperly flagging certain design entities 318 as not being reusable and therefore giving rise to unnecessary re-synthesis of those design entities 318. Thus, in some examples, constants are pushed across boundaries early in the boundary change check 404 process, according to a constant propagation technique. An example of such a technique is described below with reference to method 600 shown in FIG. 6. In some examples, the early propagation of constants across boundaries during the boundary change check 404 may maintain word level datapath structures. In some examples, the constant propagation technique involves identifying constant propagation optimizations early in the analysis operation 312.

In some examples, the reusable design entities 322 are selected or identified at least in part based on processing the boundary optimization information of the reuse information 308 to determine that the one or more reusable design entities 322 satisfy the boundary optimization condition. In some examples, the boundary optimization condition is satisfied if the design entity has no boundary changes that are any of the following: a Boolean satisfiability change across a boundary of the design entity, a binary decision diagram change across a boundary of the design entity, or a push feedthrough change outside the design entity. In some examples, one or more of these changes may be permitted by the boundary optimization condition, and/or one or more other types of change may be forbidden by the boundary optimization condition. Further details of the boundary change check 404 are described below with reference to FIG. 6.

Design entities of the implementation of previous RTL design 306 that satisfy the content matching condition checked by the content match check 402, and that also satisfy the boundary optimization condition checked by the boundary change check 404, are considered to be potentially reusable.

Third, a hierarchical propagation check 406 is performed to determine whether the design entities satisfy a hierarchical boundary condition. The results of the content match check 402 and boundary change check 404 are propagated up and/or down within hierarchical relationships between design entities, and the hierarchical boundary condition is only satisfied with respect to a given design entity if its children satisfy various combinations of the content matching condition, boundary optimization condition, and/or the hierarchical boundary condition itself, depending on context.

In some examples, the reusable design entities 322 are selected or identified at least in part based on processing the boundary optimization information and the hierarchy information of the reuse information 308 to determine that the reusable design entities 322 satisfy the hierarchical boundary condition. In some examples, the hierarchical boundary condition requires that any children of a design entity either satisfy the content matching condition or satisfy the boundary optimization condition. In some examples, the hierarchical boundary condition further requires that a design entity have no child that fails to satisfy the hierarchical boundary condition and also fails to satisfy the boundary optimization condition. Further details of the hierarchical propagation check 406 are described below with reference to FIG. 7 through FIG. 18.

Re-timing is an EDA option that may be enabled for certain design entities in some types of EDA software. If re-timing is enabled for a given design entity, there may be problems reusing the design entity or others in a hierarchical parent relationship with the design entity, because re-timing could have been performed across the hierarchical boundary. Thus, in some examples, any design entity with re-timing enabled is treated as having failed to satisfy the content matching condition and also as having failed to satisfy the boundary optimization condition. The consequences of such condition failures for various hierarchically related design entities to satisfy the hierarchical boundary condition will be apparent from the examples shown in FIG. 7 through FIG. 18 below.

Examples of design entities in hierarchical relationships are shown in FIG. 7 through FIG. 18, with various patterns of passing or failing the content match check 402, boundary change check 404, and hierarchical propagation check 406, thereby illustrating examples of the application of a hierarchical propagation check 406.

Once the final set of reusable design entity 322 has been identified in the reuse information 308, those design entities of the current RTL design 304 that must be re-synthesized (and cannot simply be replaced with the reusable design entity 322 of the implementation of previous RTL design 306) are synthesized, in the context of the implementation of previous RTL design 306, by an incremental synthesis 408 operation. This operation 408 may synthesize netlists and/or other lower-level representations of the design entities 320 of the current RTL design 304 according to known techniques for logic synthesis, e.g., compiling HDL code. However, during the incremental synthesis 408 operation, various types of information recorded during the boundary change check 404 (as described below with reference to FIG. 6) may be re-played or applied to ensure compliance with boundary optimization performed on the implementation of previous RTL design 306.

The output of the incremental synthesis 408 operation is incremental synthesized logic 310, including newly synthesized design entities 324 for each design entity of the current RTL design 304 that is not replaced with a reusable design entity 322 from the implementation of previous RTL design 306.

Figure 5:
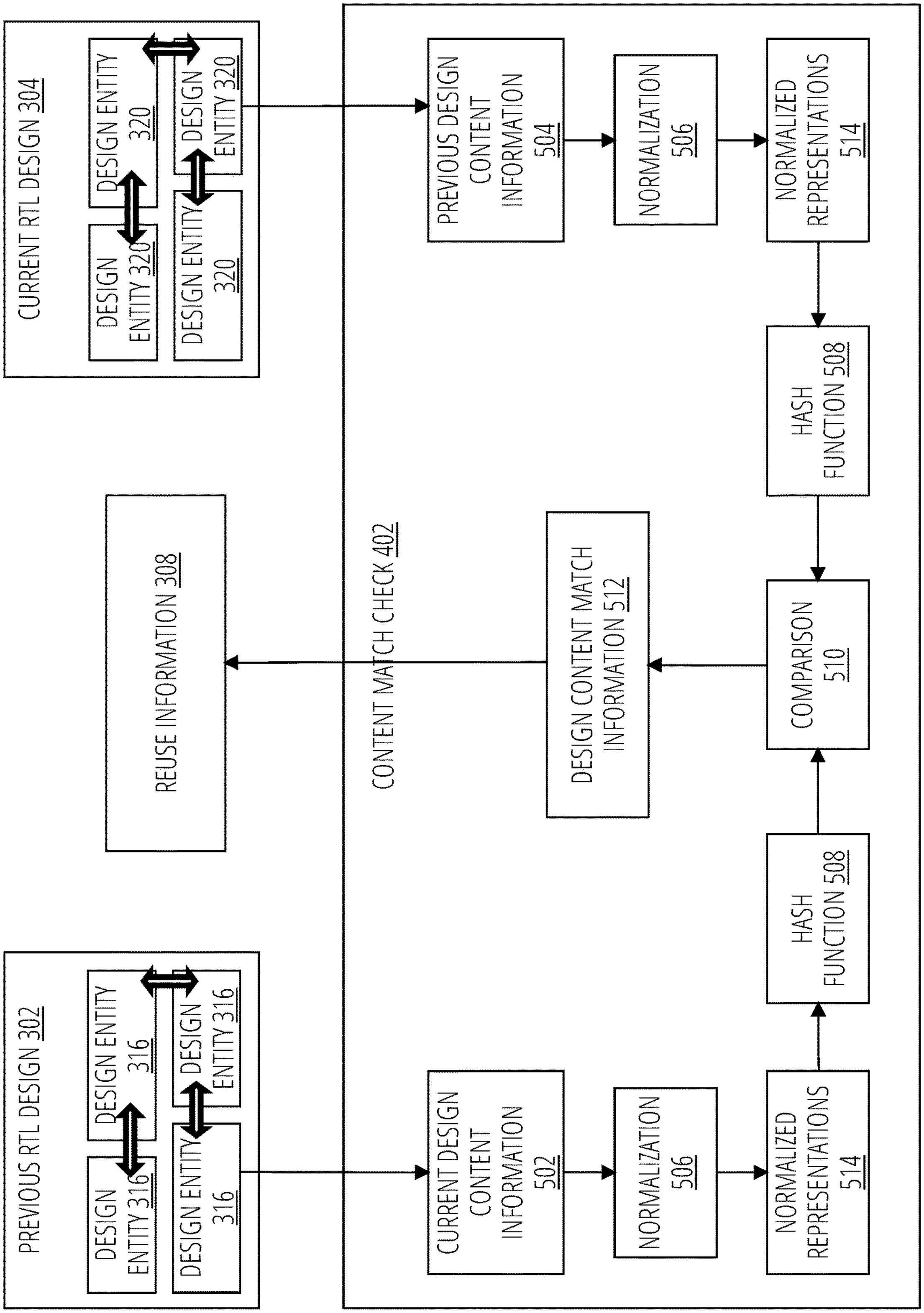
FIG. 5 illustrates a schematic diagram of the operations of the content match check of FIG. 4, according to some examples.

FIG. 5 shows a schematic diagram of the operations of the content match check of FIG. 4. As shown in FIG. 4, the implementation of previous RTL design 306 and the current RTL design 304 are provided as inputs to the content match check 402. In some examples, as described above, the previous RTL design 302 may be provided as a further input or an alternative to the implementation of previous RTL design 306.

In the illustrated example, the content match check 402 obtains current design content information 502 from the current RTL design 304 and previous design content information 504 from the previous RTL design 302. The current design content information 502 and previous design content information 504 both contain register-transfer level entity data for each of the design entities of their respective RTL designs.

Each corresponding pair of design entities from the current design content information 502 and previous design content information 504 are then compared to determine if their RTL content matches (e.g., whether there are any meaningful RTL changes from version N to version N+1 of the given design entity, as described above). A normalization operation 506 is used to normalize the non-register-transfer level content (e.g., whitespace, comments, metadata) of the register-transfer level entity data of each pair of corresponding design entities being compared. In some examples, the normalization operation replaces the non-meaningful data with generic matching placeholders. The normalization operation 506 generates a normalized representations 514 of each design entity being compared, such as a copy of the design entity with the non-RTL content being removed or replaced with generic placeholder content. A hash function 508, such as a checksum operation, is then applied to both normalized representations 514 to generate a pair of hash values, which are compared by a comparison operation 510 to determine whether the design entity satisfies the content matching condition, e.g., whether the checksums (or other hash values) match. The positive or negative result of the comparison operation 510 is output by the content match check 402 as design content match information 512, which may form part of the reuse information 308.

Thus, in some examples, the content match check 402 generates the design content match information 512 as part of the reuse information 308 by identifying the one or more reusable design entities 322 as satisfying a content matching condition, and the content matching condition requires that a design entity of the previous RTL design 302 has RTL content matching RTL content of one or more corresponding design entities of the current RTL design 304.

In some examples, the content match check 402 generates current design content information 502 representative of RTL content of the plurality of design entities of the current RTL design 304, obtains previous design content information 504 representative of RTL content of each design entity of the previous RTL design 302 corresponding to a design entity of the current RTL design 304, compares the current design content information 502 to the previous design content information 504 to generate the design content match information 512, and selects the one or more reusable design entities 322 of the reuse information 308 based at least in part on the design content match information 512.

In some examples, the current design content information 502 includes a hash value for each design entity of the current RTL design 304, and the previous design content information 504 includes a hash value for each design entity of the previous RTL design 302.

Figure 6:
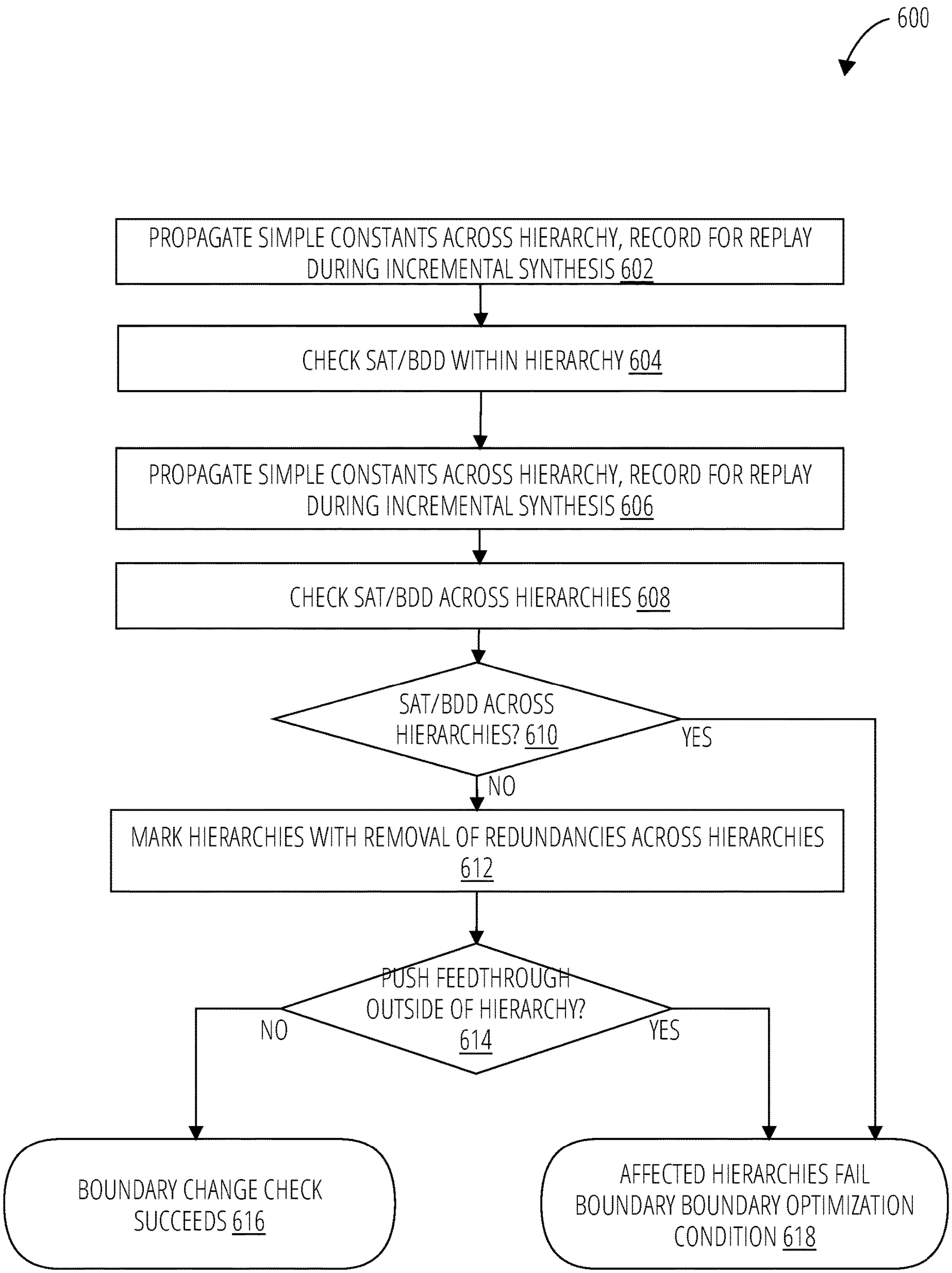
FIG. 6 illustrates a flowchart showing operations of a method for checking a boundary optimization condition, according to some examples.

FIG. 6 shows operations of a method 600 for checking a boundary optimization condition. Method 600 may implement the boundary change check 404 in some examples, and the method 600 is described below with reference to the elements of analysis operation 312 shown in FIG. 4. However, it will be appreciated that other examples may implement the operations of method 600 using other suitable means.

Although the example method 600 depicts a particular sequence of operations, the sequence may be altered without departing from the scope of the present disclosure. For example, some of the operations depicted may be performed in parallel or in a different sequence that does not materially affect the function of the method 600. In other examples, different components of an example device or system that implements the method 600 may perform functions at substantially the same time or in a specific sequence.

Method 600 may be performed on each design entity as part of the boundary change check 404, as described above with reference to FIG. 4.

At operation 602, simple constants are propagated across the hierarchy of the design entity. The results of this propagation are stored or otherwise recorded for replay or re-application during the incremental synthesis 408 operation.

At operation 604, a check may be performed within the hierarchical boundary of the design entity for any Boolean satisfiability (SAT) changes and/or any binary decision diagram (BDD) changes. These types of changes are compatible with reuse of the design entity from the implementation of previous RTL design 306 for the purpose of incremental synthesis. Thus, in some examples, no action is taken based on the within-boundary SAT/BDD check; operation 604 may be omitted in some examples.

At operation 606, simple constants are again propagated across the hierarchy of the design entity. The results of this propagation are stored or otherwise recorded for replay or re-application during the incremental synthesis 408 operation. Operation 606 is performed again after operation 604, even though it is identical to operation 602, because the results of operation 604 may require the simple constant propagation and recording to be performed again in order to identify constant propagation optimizations that were not detectable prior to operation 604 but that have been exposed by operation 604.

At operation 608, a check may be performed across the hierarchical boundary of the design entity for any Boolean satisfiability (SAT) changes and/or any binary decision diagram (BDD) changes. In some examples, these types of changes may be incompatible with reuse of the design entity from the implementation of previous RTL design 306 for the purpose of incremental synthesis. Thus, following operation 608 at decision block 610, if there are any SAT/BDD changes across the hierarchical boundary of the design entity, method 600 proceeds to operation 618, where the hierarchies affected by the SAT/BDD changes detected in operation 608 are deemed to render the design entities of the hierarchy non-reusable. However, in some examples SAT and/or BDD changes may be permissible (e.g., they may not render a design entity non-reusable). In some examples, operation 608 may be omitted from method 600.

Otherwise, if no SAT/BDD changes across boundaries are detected at operation 608, the method 600 proceeds to operation 612. At operation 612, the hierarches affected by the detected boundary changes from operations operation 602 and operation 606 are marked, with removal of redundancies across the hierarchies.

At decision block 614, if there are any boundary changes that include push feedthrough outside of the hierarchy, the method 600 proceeds to operation 618: the hierarchies affected by the push feedthrough render the design entities of the hierarchy non-reusable.

Otherwise, the method 600 proceeds to operation 616, where the design entity is deemed to pass the boundary change check 404.

In some examples, additional post-processing and/or condition checking is included in method 600, such as additional processing and/or analysis as part of decision block 614 and/or operation 616.

FIG. 7 through FIG. 18 shows examples of the hierarchical propagation check 406 module or operation of FIG. 4, as performed to check various example design entity hierarchies for satisfaction of the hierarchical boundary condition. As described above, the results of the content match check 402 and boundary change check 404 are propagated up and/or down within hierarchical relationships between design entities, and the hierarchical boundary condition is only satisfied with respect to a given design entity (e.g., the hierarchical propagation check 406 is passed and the design entity can be reused) if its children satisfy various combinations of the content matching condition, boundary optimization condition, and/or the hierarchical boundary condition itself, depending on context.

In some examples, the reusable design entities 322 are selected or identified at least in part based on processing the boundary optimization information and the hierarchy information of the reuse information 308 to determine that the reusable design entities 322 satisfy the hierarchical boundary condition. In some examples, the hierarchical propagation check 406 is intended to ensure that the cached copy of a design entity 318 from the implementation of previous RTL design 306 does not contain constant related optimization that is incompatible with the way that the corresponding design entity 320 is used in the current RTL design 304. In some examples, the hierarchical boundary condition requires that any children of a design entity either satisfy the content matching condition or satisfy the boundary optimization condition. In some examples, the hierarchical boundary condition further requires that a design entity have no child that fails to satisfy the hierarchical boundary condition and also fails to satisfy the boundary optimization condition.

The examples of FIG. 7 through FIG. 18 describe design entities being "reusable" or "reused" and that this refers to the inclusion of the design entities of the implementation of previous RTL design 306 among the reusable design entity 322 identified by the reuse information 308. However, it will be appreciated that the same principle can be articulated as a design entity of current RTL design 304 being "replaced" by its counterpart in the implementation of previous RTL design 306. In some examples described below, these two usages ("reuse" vs. "replace") will be used to refer to the same principle.

Figure 7:
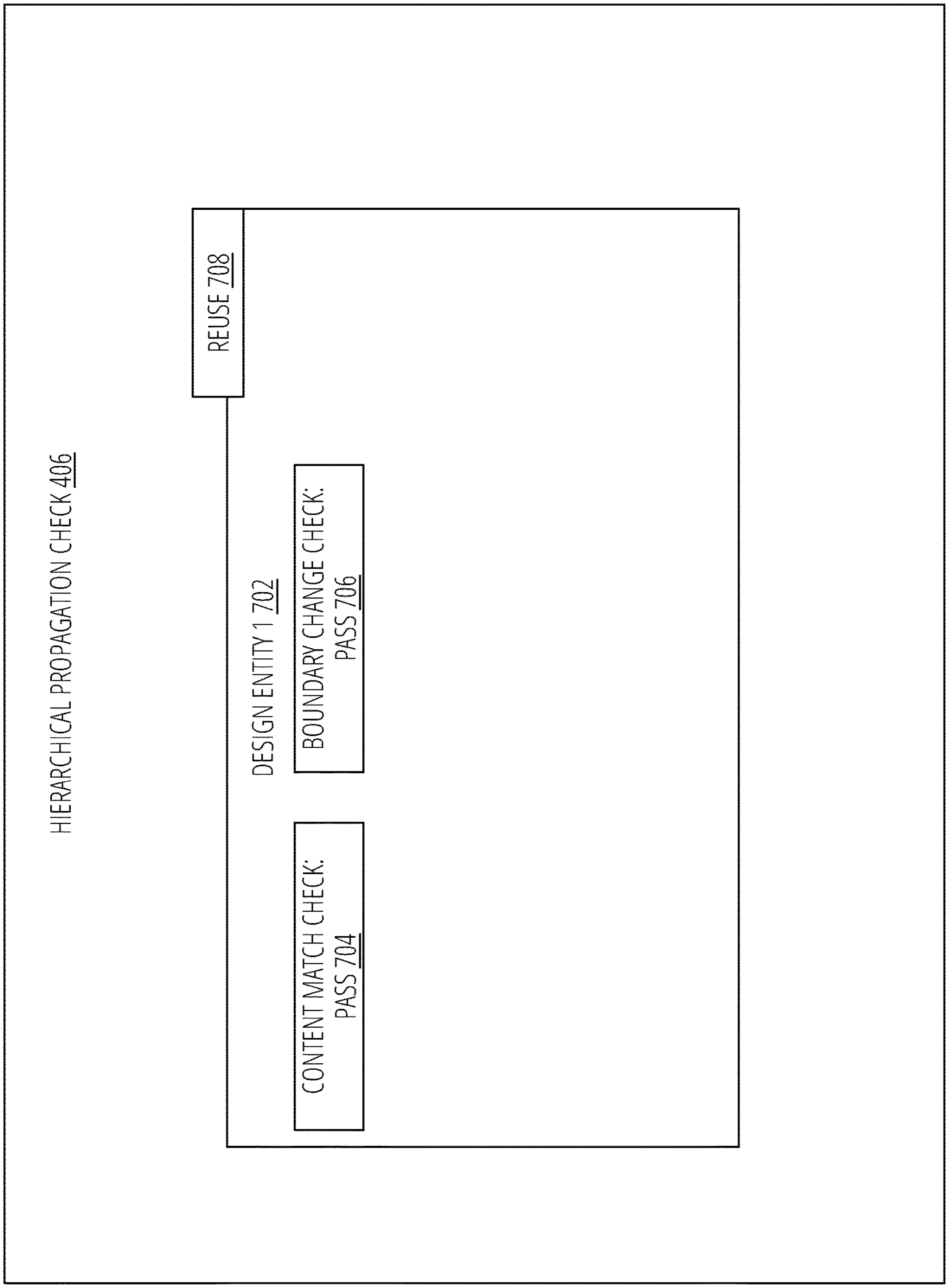
FIG. 7 illustrates a schematic diagram of the hierarchical propagation check module of FIG. 4 checking a first example design entity hierarchy, according to some examples.

FIG. 7 shows the hierarchical propagation check 406 being performed on a first example design entity hierarchy. The first example design entity hierarchy includes only a single module, design entity 1 702. In this example, the design entity 1 702 satisfies the content match check 402 (shown as content match check: pass 704), and also satisfies the boundary change check 404 (shown as boundary change check: pass 706). Accordingly, the design entity 1 702 can be reused (shown as the outcome reuse 708).

Thus, in some examples of the hierarchical propagation check 406, a design entity that satisfies both the content match check 402 and the boundary change check 404 can be reused if it has no children.

Figure 8:
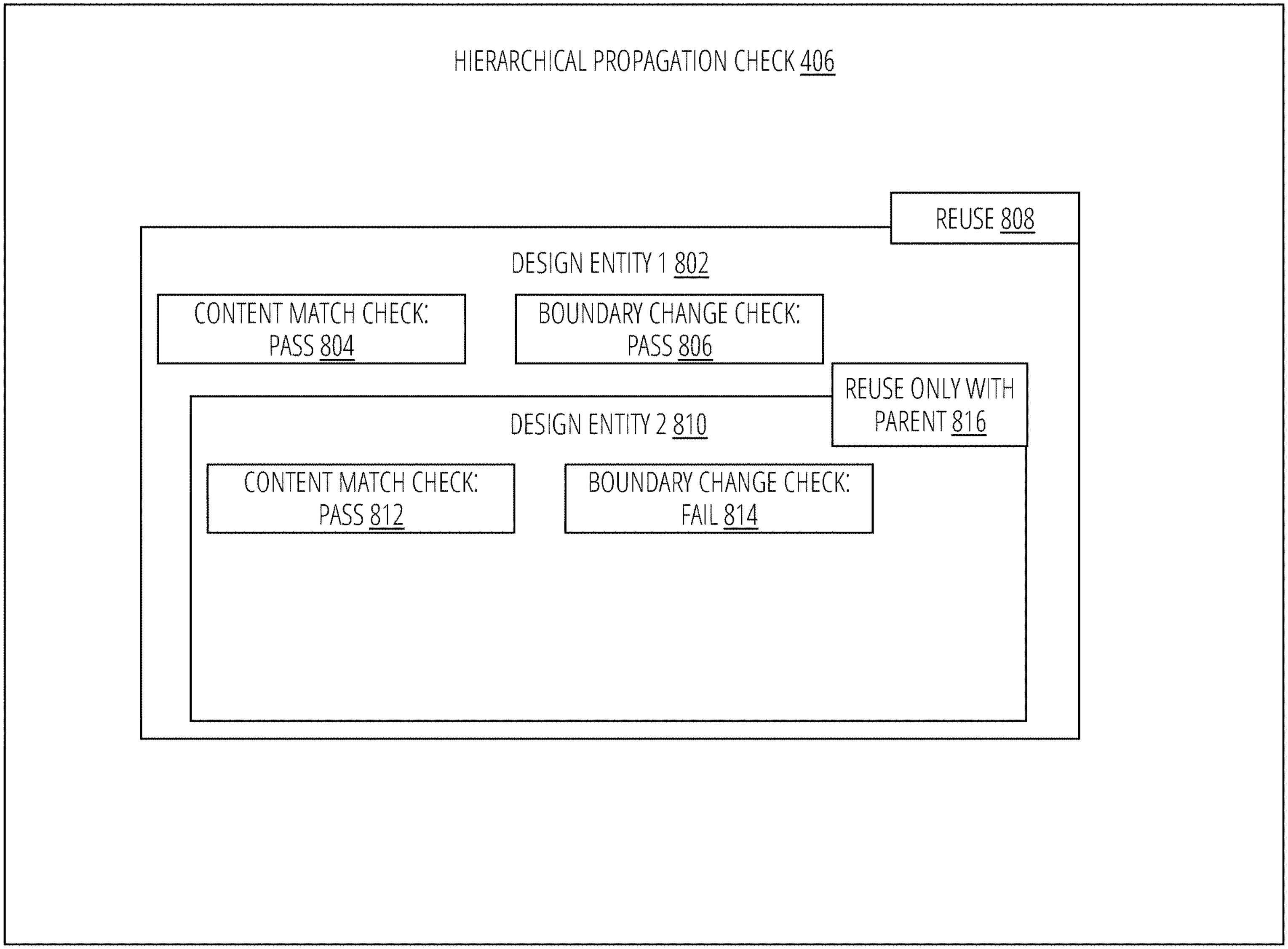
FIG. 8 illustrates a schematic diagram of the hierarchical propagation check module of FIG. 4 checking a second example design entity hierarchy, according to some examples.

FIG. 8 shows the hierarchical propagation check 406 being performed on a second example design entity hierarchy. The second example design entity hierarchy includes two modules, design entity 1 802 and design entity 2 810. In this example, the design entity 1 802 satisfies the content match check 402 (shown as content match check: pass 804), and also satisfies the boundary change check 404 (shown as boundary change check: pass 806).

However, the child of design entity 1 802, design entity 2 810, only satisfies the content match check 402 (shown as content match check: pass 812), but fails to satisfy the boundary change check 404 (shown as boundary change check: fail 814). This means that design entity 2 810 can be reused only in the context of its parent design entity (in this case design entity 1 802) within the reuse information 308 (shown as the outcome reuse only with parent 816). However, the parent, design entity 1 802, can be reused (shown as the outcome reuse 808). Therefore, the child, design entity 2 810, can also be reused if the parent design entity 1 802 is reused.

Thus, in some examples, if a design entity satisfies the content matching condition but not the boundary optimization condition, can be reused only in the context of its parent in the reuse information 308. Therefore, if the parent is not reusable for any reason (e.g., failing to satisfy the content matching condition, the boundary optimization condition, and/or the hierarchical boundary condition), then the child is also not reusable, regardless of other considerations.

Figure 9:
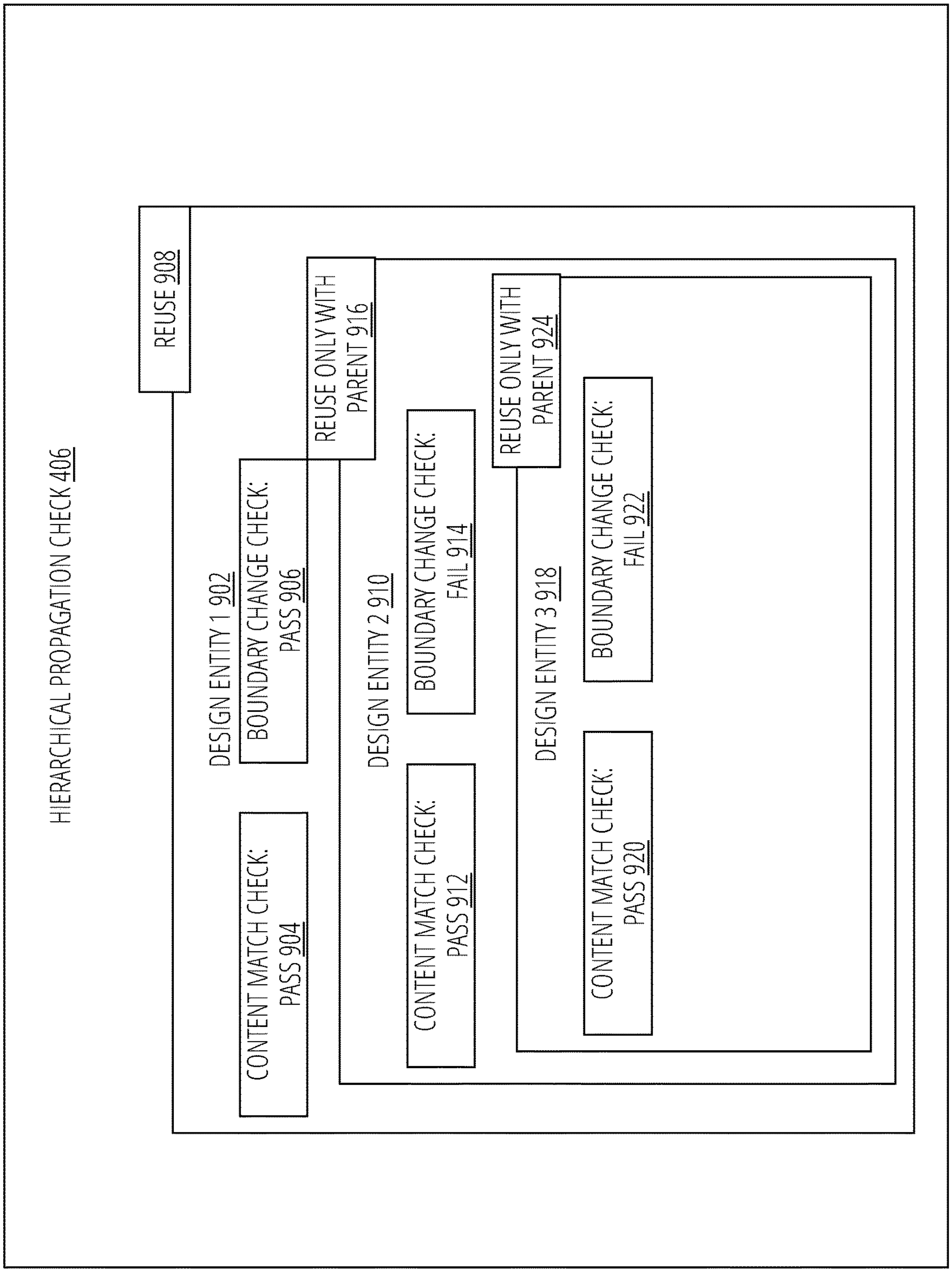
FIG. 9 illustrates a schematic diagram of the hierarchical propagation check module of FIG. 4 checking a third example design entity hierarchy, according to some examples.

FIG. 9 shows the hierarchical propagation check 406 being performed on a third example design entity hierarchy. The third example design entity hierarchy includes three modules, design entity 1 902, design entity 2 910, and design entity 3 918. In this example, the design entity 1 902 satisfies the content match check 402 (shown as content match check: pass 904), and also satisfies the boundary change check 404 (shown as boundary change check: pass 906).

However, the child of design entity 1 902, design entity 2 910, only satisfies the content match check 402 (shown as content match check: pass 912), but fails to satisfy the boundary change check 404 (shown as boundary change check: fail 914).

Furthermore, the child of design entity 2 910, design entity 3 918, also satisfies the content match check 402 (shown as content match check: pass 920) but fails to satisfy the boundary change check 404 (shown as boundary change check: fail 922).

This means that design entity 3 918 can only be reused along with its parent design entity (in this case design entity 2 910) within the reuse information 308 (reuse only with parent 924). Design entity 2 910 in turn can only be reused with its parent, design entity 1 902 (reuse only with parent 916). Design entity 1 902 can be reused (reuse 908). Thus, assuming that design entity 1 902 is reused (e.g., design entity 1 902 is included in the reuse information 308), both design entity 2 910 and design entity 3 918 can also be reused (e.g., design entity 2 910 and design entity 3 918 can be included in the reuse information 308).

Thus, in some examples, the condition that a design entity can only be reused along with its parent may propagate up the hierarchy until a reusable upstream design entity is found.

Figure 10:
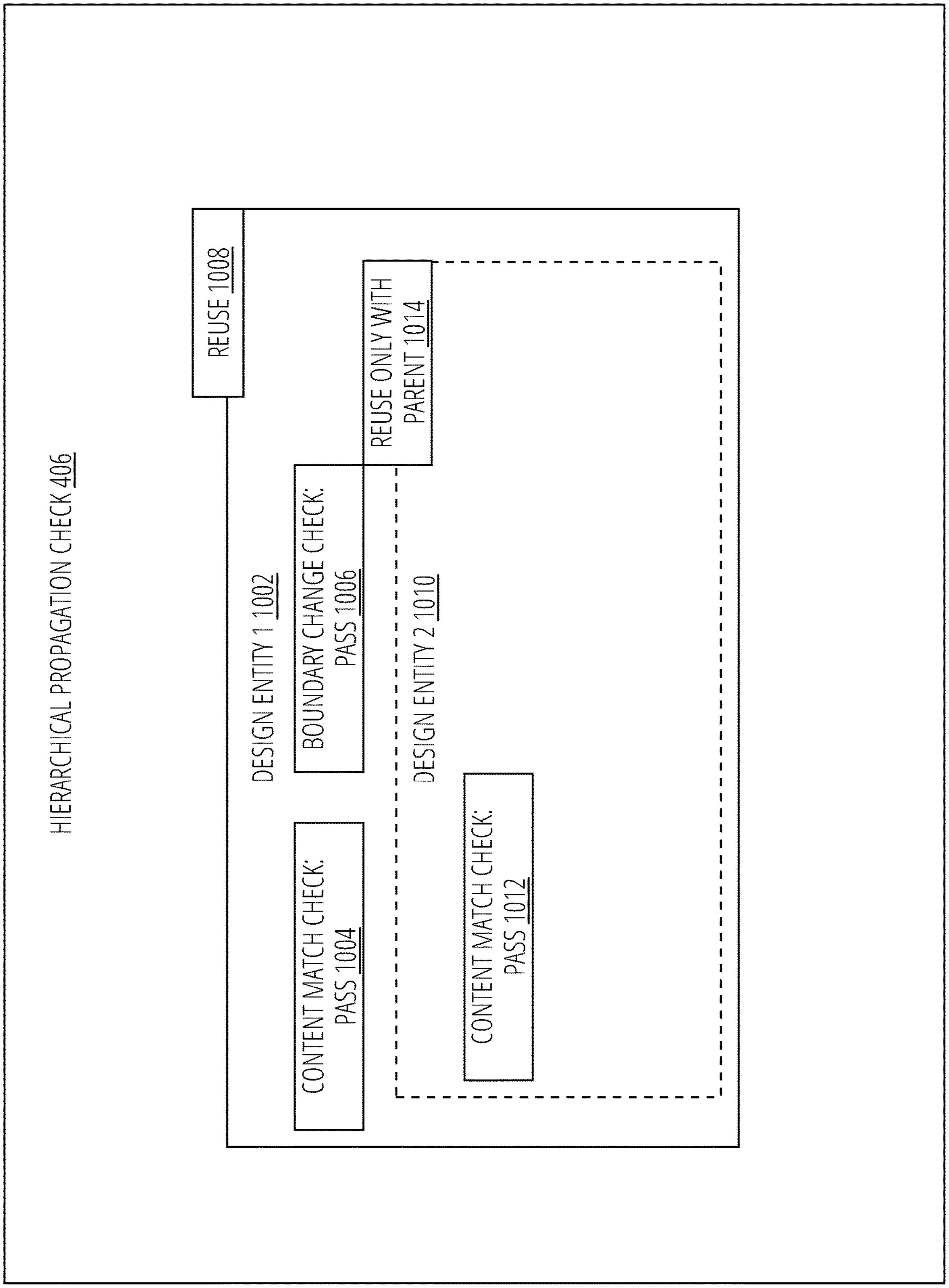
FIG. 10 illustrates a schematic diagram of the hierarchical propagation check module of FIG. 4 checking a fourth example design entity hierarchy, according to some examples.

FIG. 10 shows the hierarchical propagation check 406 being performed on a fourth example design entity hierarchy. The fourth example design entity hierarchy includes two modules, design entity 1 1002 and design entity 2 1010. In this example, the design entity 1 1002 satisfies the content match check 402 (shown as content match check: pass 1004), and also satisfies the boundary change check 404 (shown as boundary change check: pass 1006).

The child of design entity 1 1002, design entity 2 1010, satisfies the content match check 402 (shown as content match check: pass 1012), but has been ungrouped before mapping of the current RTL design 304. Ungrouping of design entity 1 1002 and its child design entity 2 1010 prior to mapping of the current RTL design 304 means that the cache 330 will contain an implemented copy of design entity 1 1002, but will not contain an implemented copy of design entity 2 1010 as a distinct design entity, because 1010 was ungrouped from 1002 prior to the cache 330 being written. This means that design entity 2 1010 can only be reused with its parent design entity (in this case design entity 1 1002) within the reuse information 308 (reuse only with parent 1014). However, the parent, design entity 1 1002, can be reused (shown as the outcome reuse 1008).

Thus, in some examples, a design entity can be included along with its parent in the reuse information 308 if it satisfies the content matching condition but has been ungrouped before mapping of the current RTL design 304.

Figure 11:
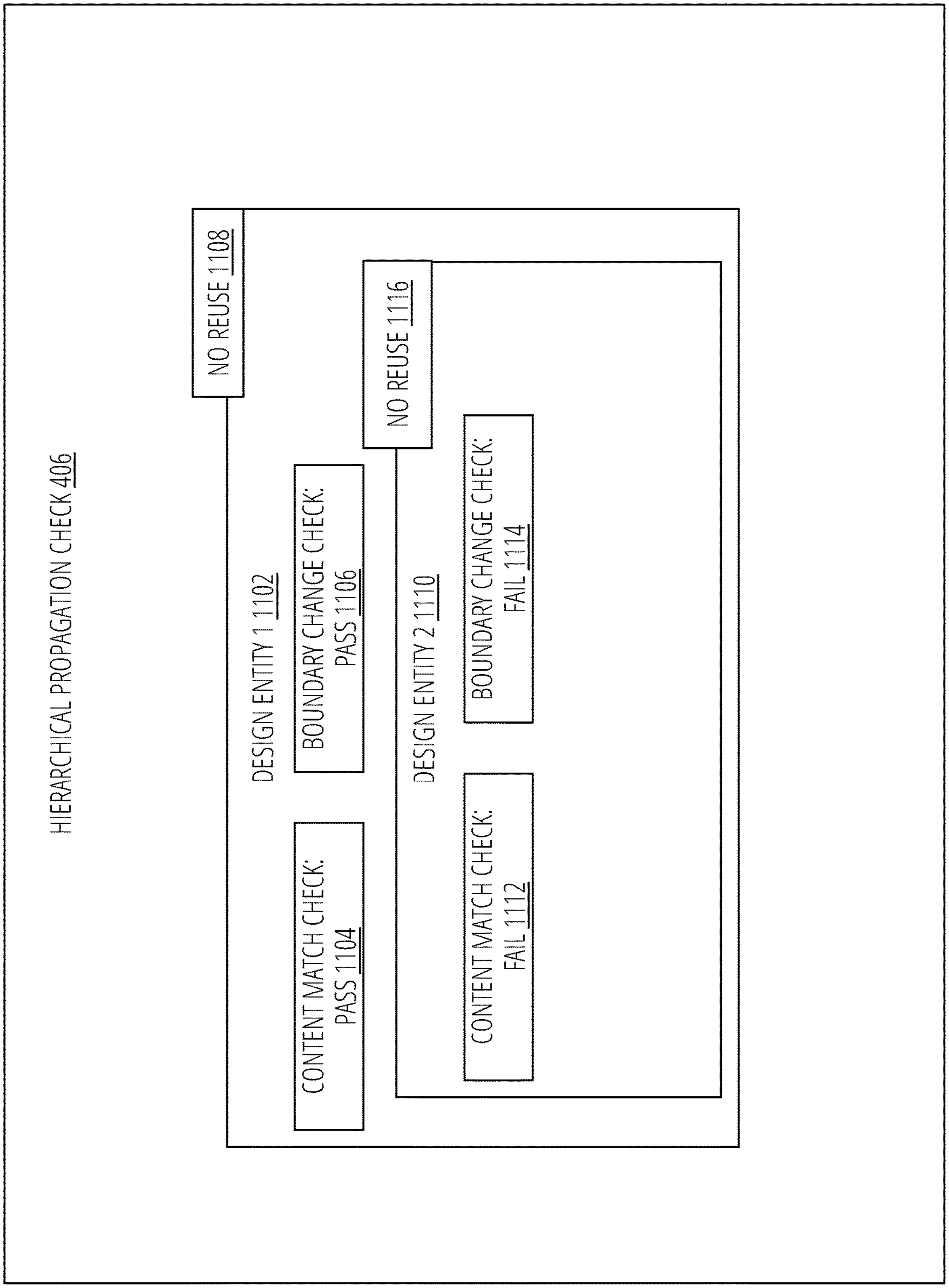
FIG. 11 illustrates a schematic diagram of the hierarchical propagation check module of FIG. 4 checking a fifth example design entity hierarchy, according to some examples.

FIG. 11 shows the hierarchical propagation check 406 being performed on a fifth example design entity hierarchy. The fifth example design entity hierarchy includes two modules, design entity 1 1102 and design entity 2 1110. In this example, the design entity 1 1102 satisfies the content match check 402 (shown as content match check: pass 1104), and also satisfies the boundary change check 404 (shown as boundary change check: pass 1106).

However, the child of design entity 1 1102, design entity 2 1110, does not satisfy the content match check 402 (shown as content match check: fail 1112) or the boundary change check 404 (shown as boundary change check: fail 1114). This means that not only is the design entity 2 1110 not reusable (no reuse 1116), but its parent, design entity 1 1102, is also not reusable (no reuse 1108), because it contains a child that has failed both the content matching condition and the boundary optimization condition.

Thus, in some examples, if a design entity fails to satisfy the content matching condition and the boundary optimization condition, this double failure propagates upstream through parent design entities, rendering them unusable as well. This propagation can only be halted by interposition of a parent that satisfies the boundary optimization condition: whereas that parent is still non-reusable, its own parent may be reusable, as described below with reference to FIG. 12.

Figure 12:
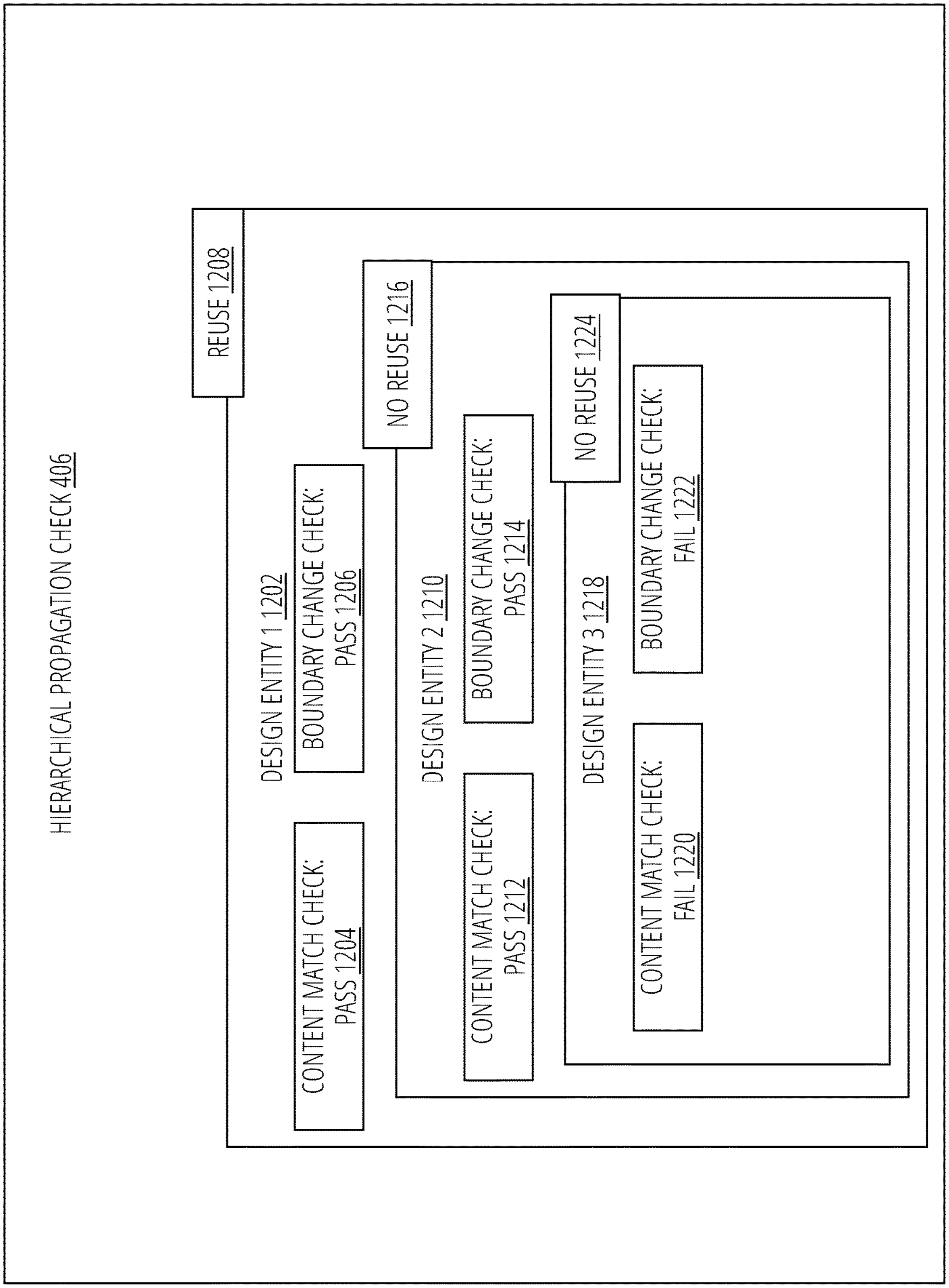
FIG. 12 illustrates a schematic diagram of the hierarchical propagation check module of FIG. 4 checking a sixth example design entity hierarchy, according to some examples.

FIG. 12 shows the hierarchical propagation check 406 being performed on a sixth example design entity hierarchy. The sixth example design entity hierarchy includes three modules, design entity 1 1202, design entity 2 1210, and design entity 3 1218. In this example, the design entity 1 1202 satisfies the content match check 402 (shown as content match check: pass 1204), and also satisfies the boundary change check 404 (shown as boundary change check: pass 1206). The design entity 2 1210 also satisfies the content match check 402 (shown as content match content match check: pass 1212) and the boundary change check 404 (shown as boundary change check: pass 1214).

However, the child of design entity 2 1210, design entity 3 1218, does not satisfy the content match check 402 (shown as content match check: fail 1220) or the boundary change check 404 (shown as boundary change check: fail 1222). This means that not only is the design entity 3 1218 not reusable (no reuse 1224), but its parent, design entity 2 1210, is also not reusable (no reuse 1216), because it contains a child that has failed both the content matching condition and the boundary optimization condition.

However, because the design entity 2 1210 satisfies both the content matching condition and the boundary optimization condition, this insulates its own parent from the propagation of the double failure of design entity 3 1218. Thus, design entity 1 1202 is reusable (reuse 1208).

Figure 13:
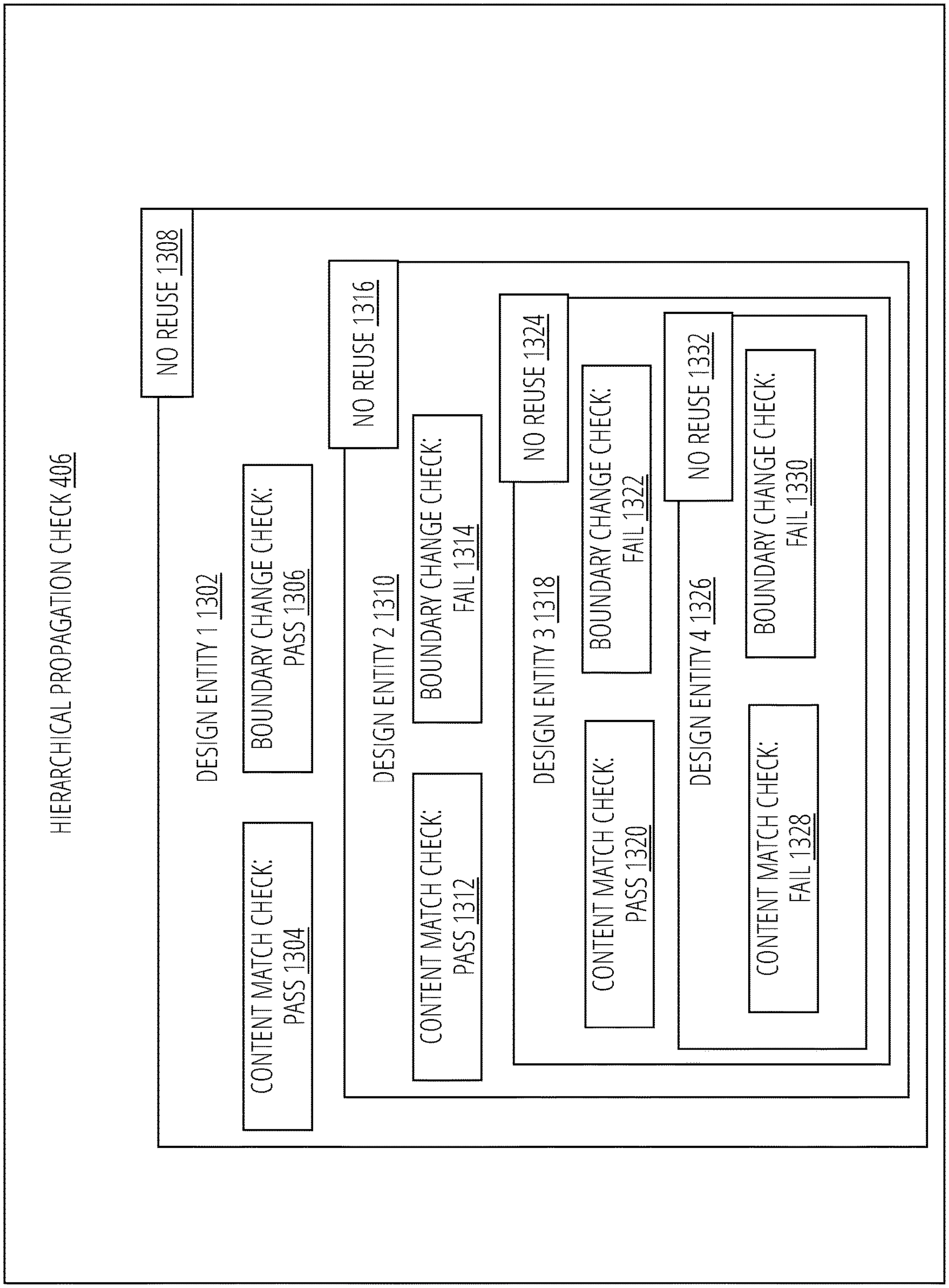
FIG. 13 illustrates a schematic diagram of the hierarchical propagation check module of FIG. 4 checking a seventh example design entity hierarchy, according to some examples.

FIG. 13 shows the hierarchical propagation check 406 being performed on a seventh example design entity hierarchy. The seventh example design entity hierarchy includes four modules, design entity 1 1302, design entity 2 1310, design entity 3 1318, and design entity 4 1326. In this example, the design entity 1 1302 satisfies the content match check 402 (shown as content match check: pass 1304), and also satisfies the boundary change check 404 (shown as boundary change check: pass 1306). The design entity 2 1310 also satisfies the content match check 402 (shown as content match content match check: pass 1312) but fails the boundary change check 404 (shown as boundary change check: fail 1314). The design entity 3 1318 also satisfies the content match check 402 (shown as content match content match check: pass 1320) but fails the boundary change check 404 (shown as boundary change check: fail 1322).

The child of design entity 3 1318, design entity 4 1326, does not satisfy the content match check 402 (shown as content match check: fail 1328) or the boundary change check 404 (shown as boundary change check: fail 1330). This means that not only is the design entity 4 1326 not reusable (no reuse 1332), but its parent, design entity 3 1318, is also not reusable (no reuse 1324), because it contains a child that has failed both the content matching condition and the boundary optimization condition.

Furthermore, because the design entity 3 1318 has not passed both checks 402, 404, the double failure of design entity 4 1326 continues to propagate upstream to render design entity 2 1310 non-reusable as well (no reuse 1316). And because design entity 2 1310 has not passed the boundary change check 404, the failure continues to propagate upward again to render design entity 1 1302 non-reusable (no reuse 1308). Design entity 1 1302 has passed the boundary change check 404, so if it had a parent, that parent might be reusable, as the double failure of design entity 4 1326 would stop propagating upstream after encountering design entity 1 1302.

Figure 14:
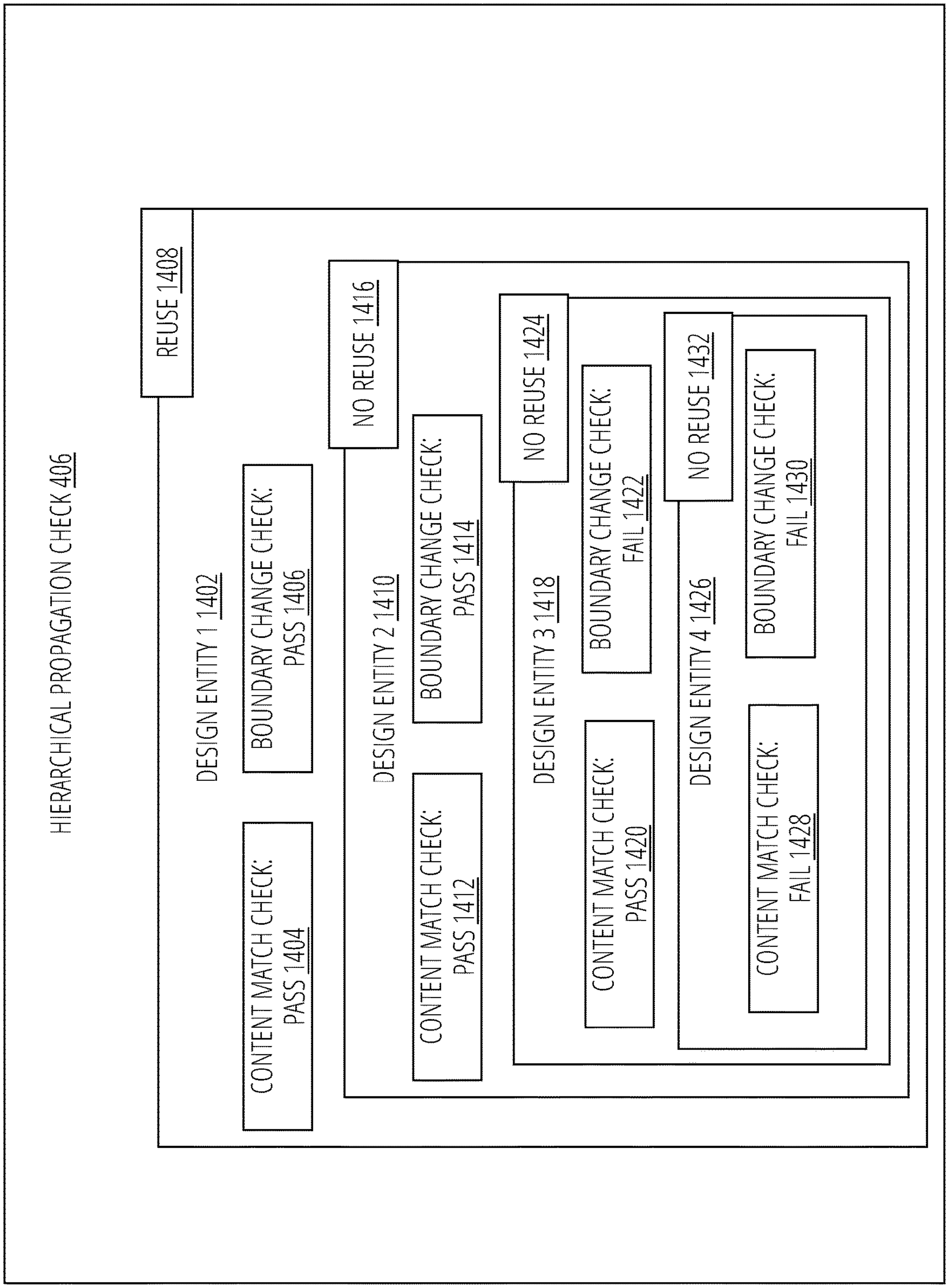
FIG. 14 illustrates a schematic diagram of the hierarchical propagation check module of FIG. 4 checking an eighth example design entity hierarchy, according to some examples.

FIG. 14 shows the hierarchical propagation check 406 being performed on an eighth example design entity hierarchy. The eighth example design entity hierarchy includes four modules, design entity 1 1402, design entity 2 1410, design entity 3 1418, and design entity 4 1426. The conditions are identical to those of FIG. 13, except that design entity 2 1410 passes both checks, thereby insulating design entity 1 1402 and allowing it to be reused.

In this example, the design entity 1 1402 satisfies the content match check 402 (shown as content match check: pass 1404), and also satisfies the boundary change check 404 (shown as boundary change check: pass 1406). The design entity 2 1410 also satisfies the content match check 402 (shown as content match content match check: pass 1412) and the boundary change check 404 (shown as boundary change check: pass 1414). The design entity 3 1318 satisfies the content match check 402 (shown as content match content match check: pass 1420) but fails the boundary change check 404 (shown as boundary change check: fail 1422).

The child of design entity 3 1418, design entity 4 1426, does not satisfy the content match check 402 (shown as content match check: fail 1428) or the boundary change check 404 (shown as boundary change check: fail 1430). This means that not only is the design entity 4 1426 not reusable (no reuse 1432), but its parent, design entity 3 1418, is also not reusable (no reuse 1424), because it contains a child that has failed both the content matching condition and the boundary optimization condition.

Furthermore, because the design entity 3 1418 has not passed the boundary change check 404, the double failure of design entity 4 1426 continues to propagate upstream to render design entity 2 1410 non-reusable as well (no reuse 1416). However, because design entity 2 1410 has passed the boundary change check 404, the failure does not continue to propagate upstream again. Thus, design entity 1 1402 is reusable (reuse 1408).

Figure 15:
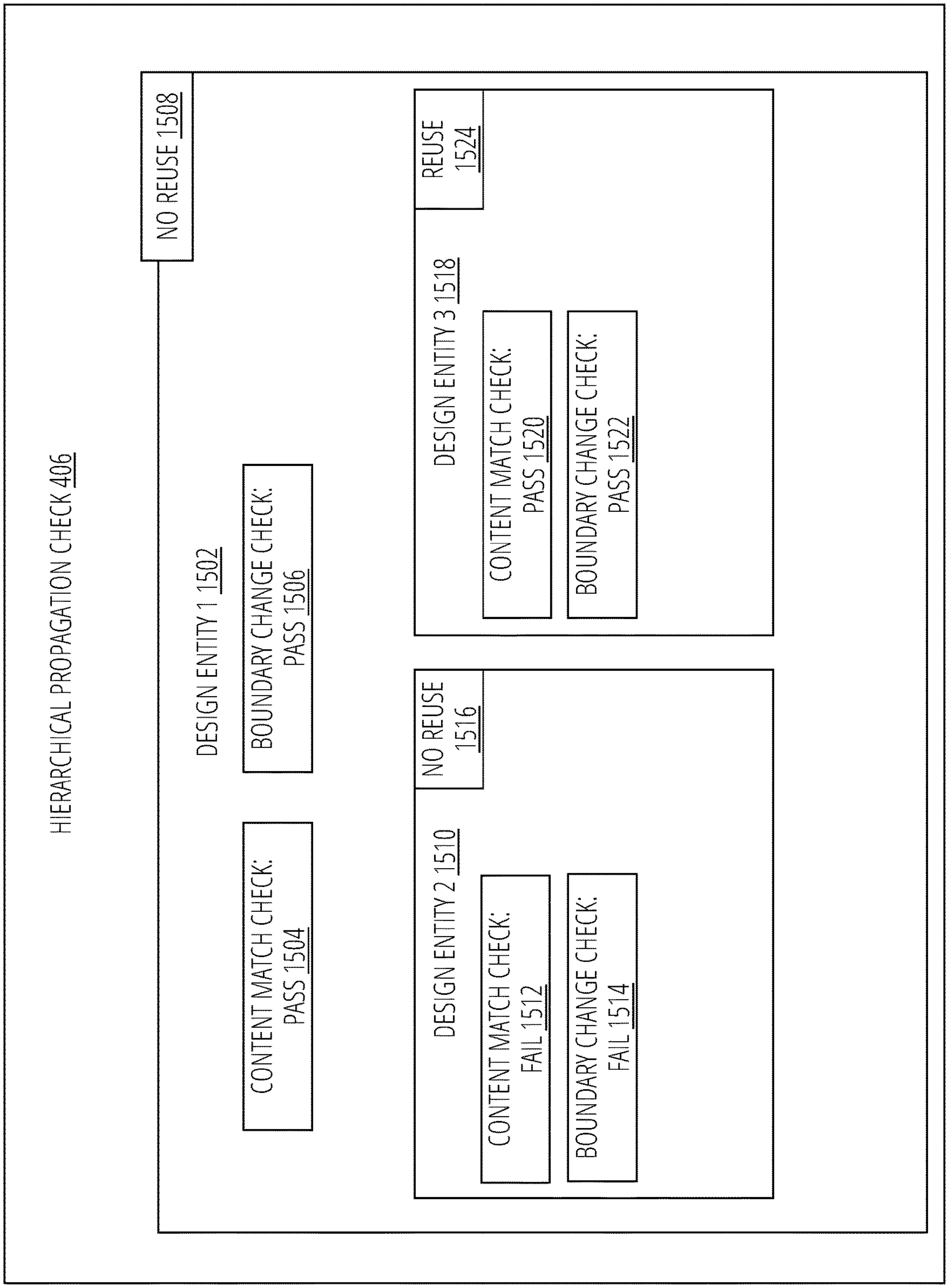
FIG. 15 illustrates a schematic diagram of the hierarchical propagation check module of FIG. 4 checking a ninth example design entity hierarchy, according to some examples.

FIG. 15 shows the hierarchical propagation check 406 being performed on a ninth example design entity hierarchy. The ninth example design entity hierarchy includes three modules, design entity 1 1502, design entity 2 1510, and design entity 3 1518. Unlike in the previous examples, both design entity 2 1510 and design entity 3 1518 are direct children of design entity 1 1502.

In this example, design entity 1 1502 satisfies the content match check 402 (shown as content match check: pass 1504), and also satisfies the boundary change check 404 (shown as boundary change check: pass 1506). The design entity 2 1510 fails the content match check 402 (shown as content match content match check: fail 1512) and also fails the boundary change check 404 (shown as boundary change check: fail 1514). The design entity 3 1518 satisfies the content match check 402 (shown as content match content match check: pass 1520) and also the boundary change check 404 (shown as boundary change check: pass 1522).

Design entity 3 1518 is reusable (reuse 1524), as it has passed both checks. Design entity 2 1510 is not reusable (no reuse 1516), as it has failed both checks. However, design entity 1 1502 is constrained by all of its children, and so it is non-reusable (no reuse 1508) because of the double failure of design entity 2 1510.

Figure 16:
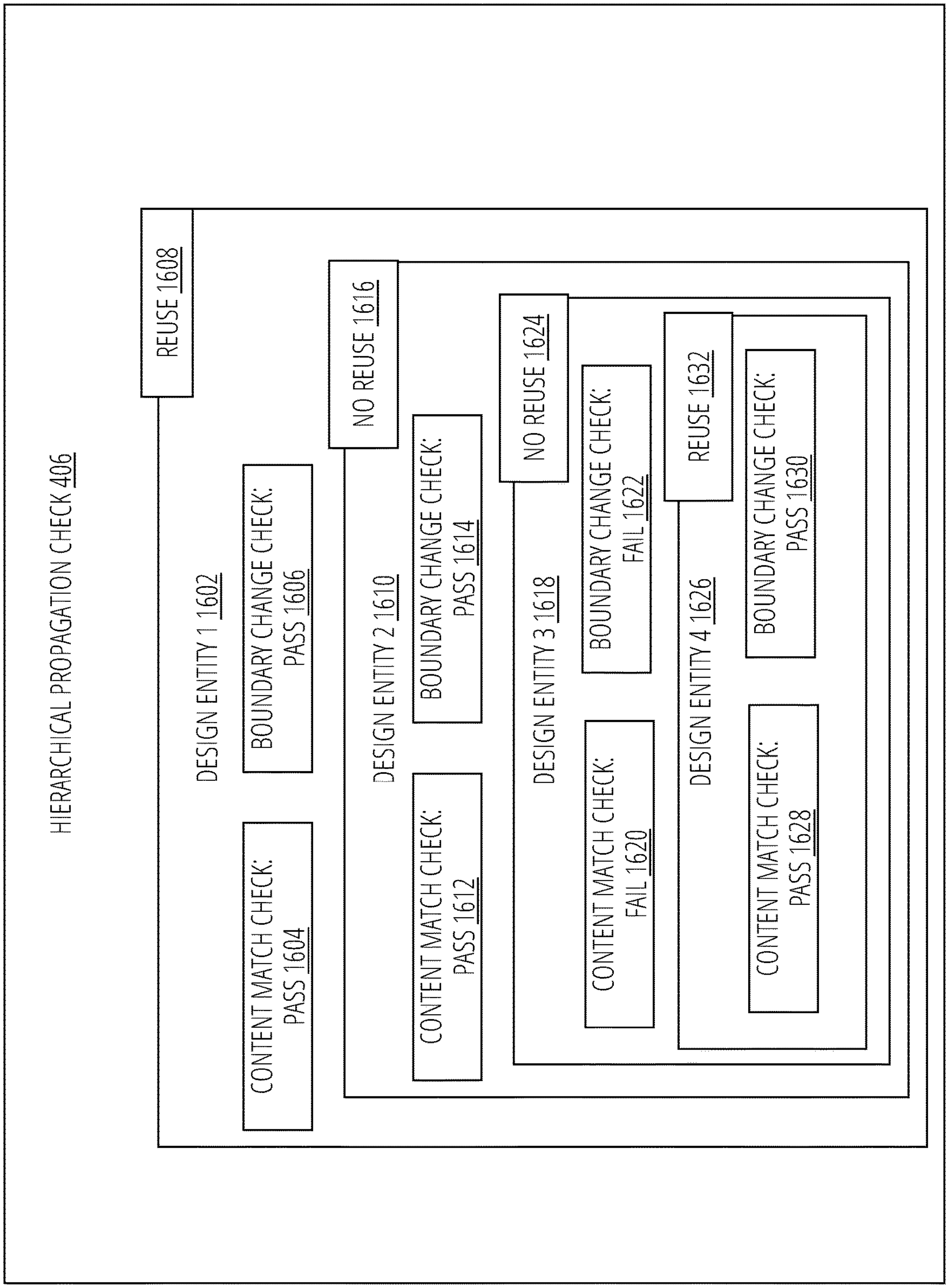
FIG. 16 illustrates a schematic diagram of the hierarchical propagation check module of FIG. 4 checking a tenth example design entity hierarchy, according to some examples.

FIG. 16 shows the hierarchical propagation check 406 being performed on a tenth example design entity hierarchy. The tenth example design entity hierarchy includes four modules, design entity 1 1602, design entity 2 1610, design entity 3 1618, and design entity 4 1626. The conditions shown in FIG. 16 result in a "doughnut" shape of reuse, in which the outermost parent and innermost child design entities can be reused, but not the two intervening design entities.

In this example, the design entity 1 1602 satisfies the content match check 402 (shown as content match check: pass 1604), and also satisfies the boundary change check 404 (shown as boundary change check: pass 1606). The design entity 2 1610 also satisfies the content match check 402 (shown as content match content match check: pass 1612) and the boundary change check 404 (shown as boundary change check: pass 1614). The design entity 3 1618 fails the content match check 402 (shown as content match content match check: fail 1620) and the boundary change check 404 (shown as boundary change check: fail 1622). The design entity 4 1626 passes both the content match check 402 (content match check: pass 1628) and the boundary change check 404 (boundary change check: pass 1630).

This means that the design entity 4 1626 is reusable (reuse 1632). The double failure of design entity 3 1618 renders it non-reusable (no reuse 1624), and also renders design entity 2 1610 non-reusable (no reuse 1616). However, because design entity 2 1610 passes both checks, design entity 1 1602 is insulated from the double failure of design entity 3 1618 and is reusable (reuse 1608).

Figure 17:
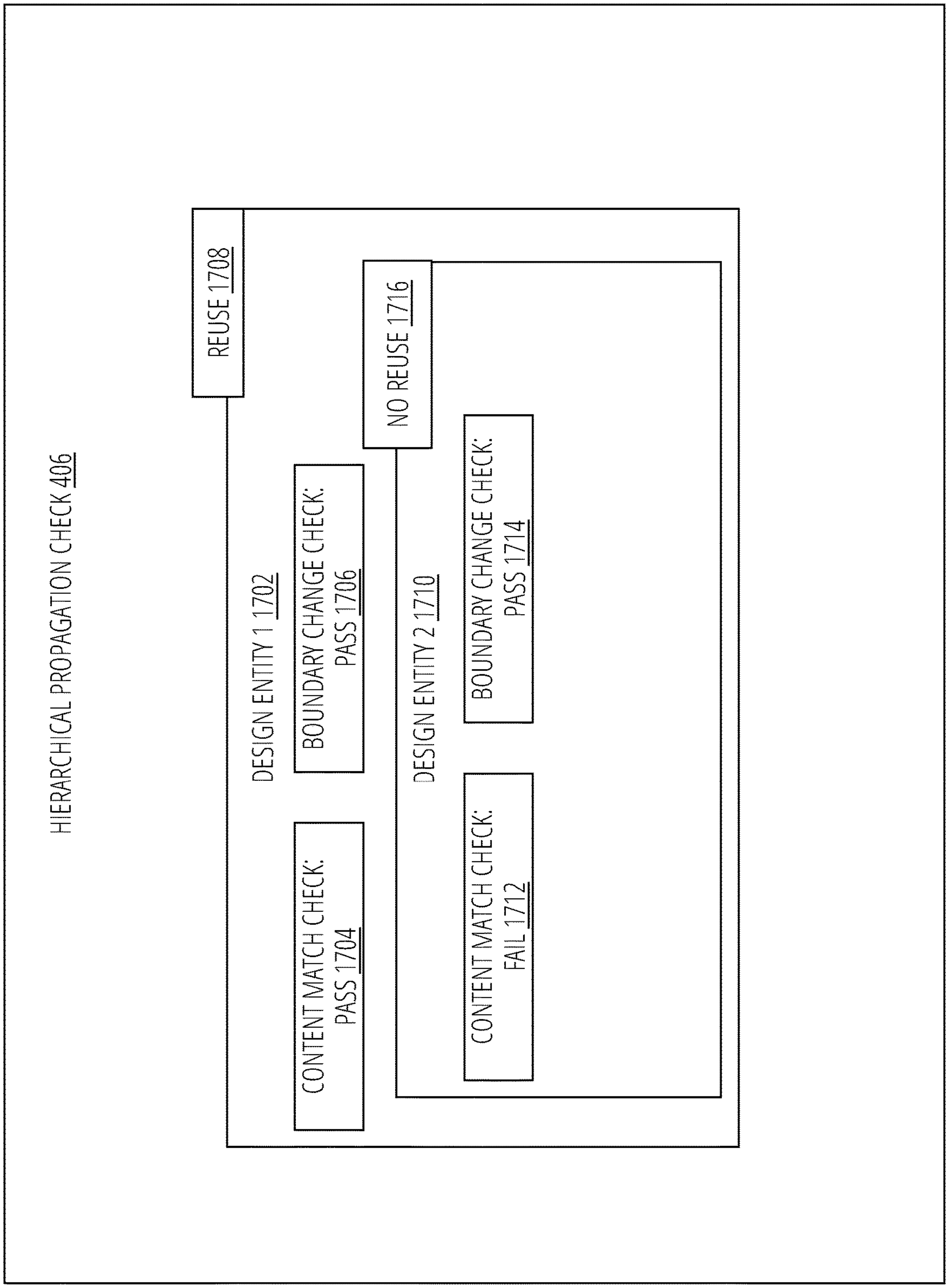
FIG. 17 illustrates a schematic diagram of the hierarchical propagation check module of FIG. 4 checking an eleventh example design entity hierarchy, according to some examples.

FIG. 17 shows the hierarchical propagation check 406 being performed on an eleventh example design entity hierarchy. The eleventh example design entity hierarchy includes two modules, design entity 1 1702 and design entity 2 content match check: pass 1704. The situation shown in FIG. 17 is similar to that of FIG. 8, except that the child has failed the content match check 402, not the boundary change check 404.

In this example, the design entity 1 1702 satisfies the content match check 402 (shown as content match check: pass 1704), and also satisfies the boundary change check 404 (shown as boundary change check: pass 1706). Design entity 2 1710 fails the content match check 402 (shown as content match check: fail 1712), but satisfies the boundary change check 404 (shown as boundary change check: pass 1714). In contrast to the "reuse-only-with-parent" outcome of design entity 2 810 in FIG. 8, failing the content match check 402 means that design entity 2 1710 is simply non-reusable (no reuse 1716). However, design entity 1 1702 is reusable (reuse 1708).

Figure 18:
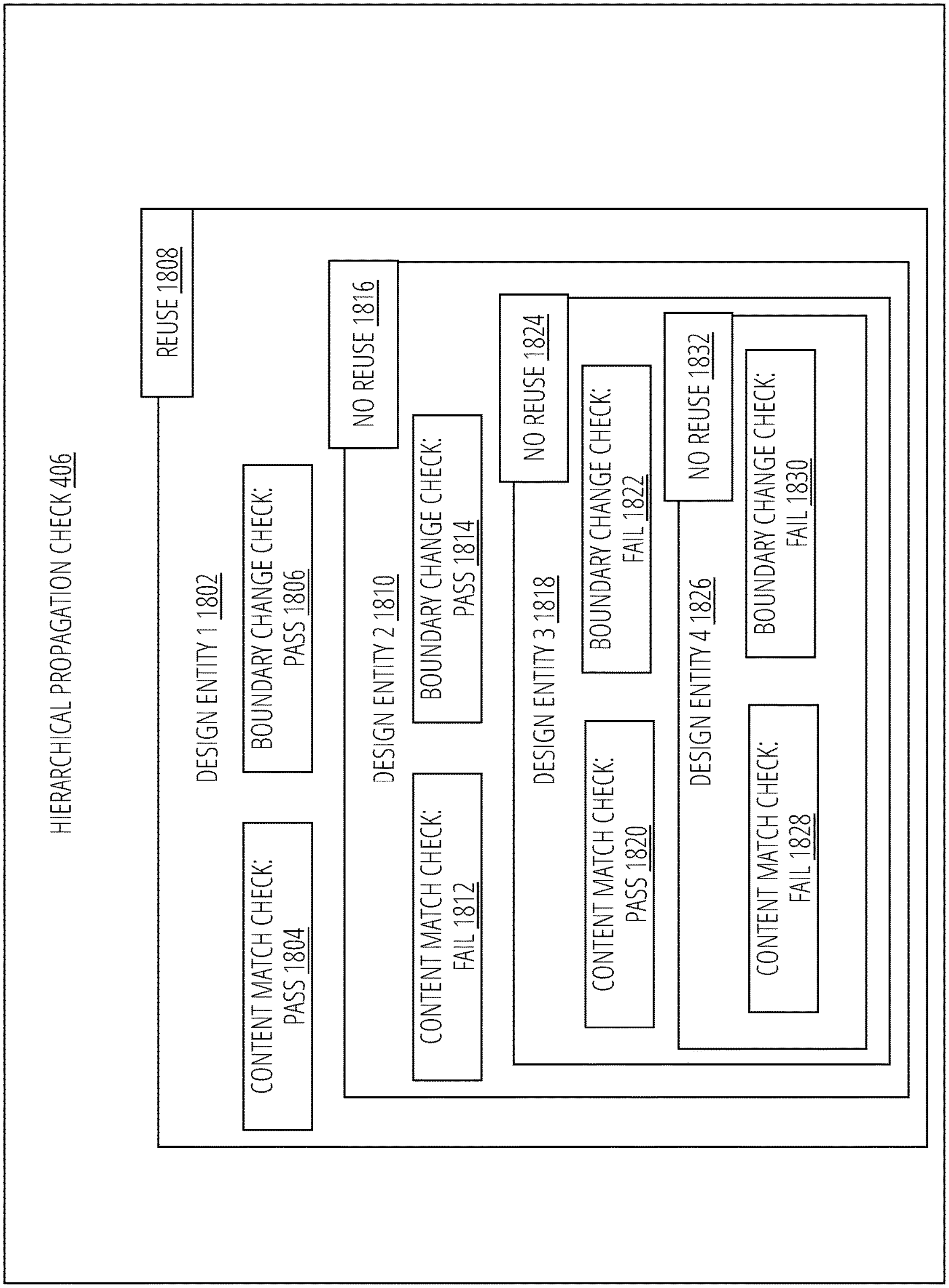
FIG. 18 illustrates a schematic diagram of the hierarchical propagation check module of FIG. 4 checking a twelfth example design entity hierarchy, according to some examples.

FIG. 18 shows the hierarchical propagation check 406 being performed on a twelfth example design entity hierarchy. The twelfth example design entity hierarchy includes four modules, design entity 1 1802, design entity 2 1810, design entity 3 1818, and design entity 4 1826.

In this example, the design entity 1 1802 satisfies the content match check 402 (shown as content match check: pass 1804), and also satisfies the boundary change check 404 (shown as boundary change check: pass 1806). The design entity 2 1810 fails the content match check 402 (shown as content match content match check: fail 1812) but passes the boundary change check 404 (shown as boundary change check: pass 1814). The design entity 3 1818 satisfies the content match check 402 (shown as content match content match check: pass 1820) but fails the boundary change check 404 (shown as boundary change check: fail 1822). The design entity 4 1826 does not satisfy the content match check 402 (shown as content match check: fail 1828) or the boundary change check 404 (shown as boundary change check: fail 1830). This means that not only is the design entity 4 1826 not reusable (no reuse 1832), but its parent, design entity 3 1818, is also not reusable (no reuse 1824), because it contains a child that has failed both the content matching condition and the boundary optimization condition.

Furthermore, because the design entity 3 1818 has not passed the boundary change check 404, the double failure of design entity 4 1826 continues to propagate upstream to render design entity 2 1810 non-reusable as well (no reuse 1816). However, because design entity 2 1810 has passed the boundary change check 404, the failure does not continue to propagate upstream again. Thus, design entity 1 1802 is reusable (reuse 1808).

Thus, in some examples, the hierarchical propagation check 406 is performed in accordance with the examples shown in FIG. 7 through FIG. 18, in order to identify the final set of reusable design entities 322 as the reuse information 308. This is the final operation of the example analysis operation 312 of FIG. 4. Returning to FIG. 3, the reuse information 308 is then combined with the incremental synthesized logic 310 generated by the incremental synthesis 408 operation at combination operation 328, an example implementation of which will be described with reference to FIG. 20 below.

Figure 19:
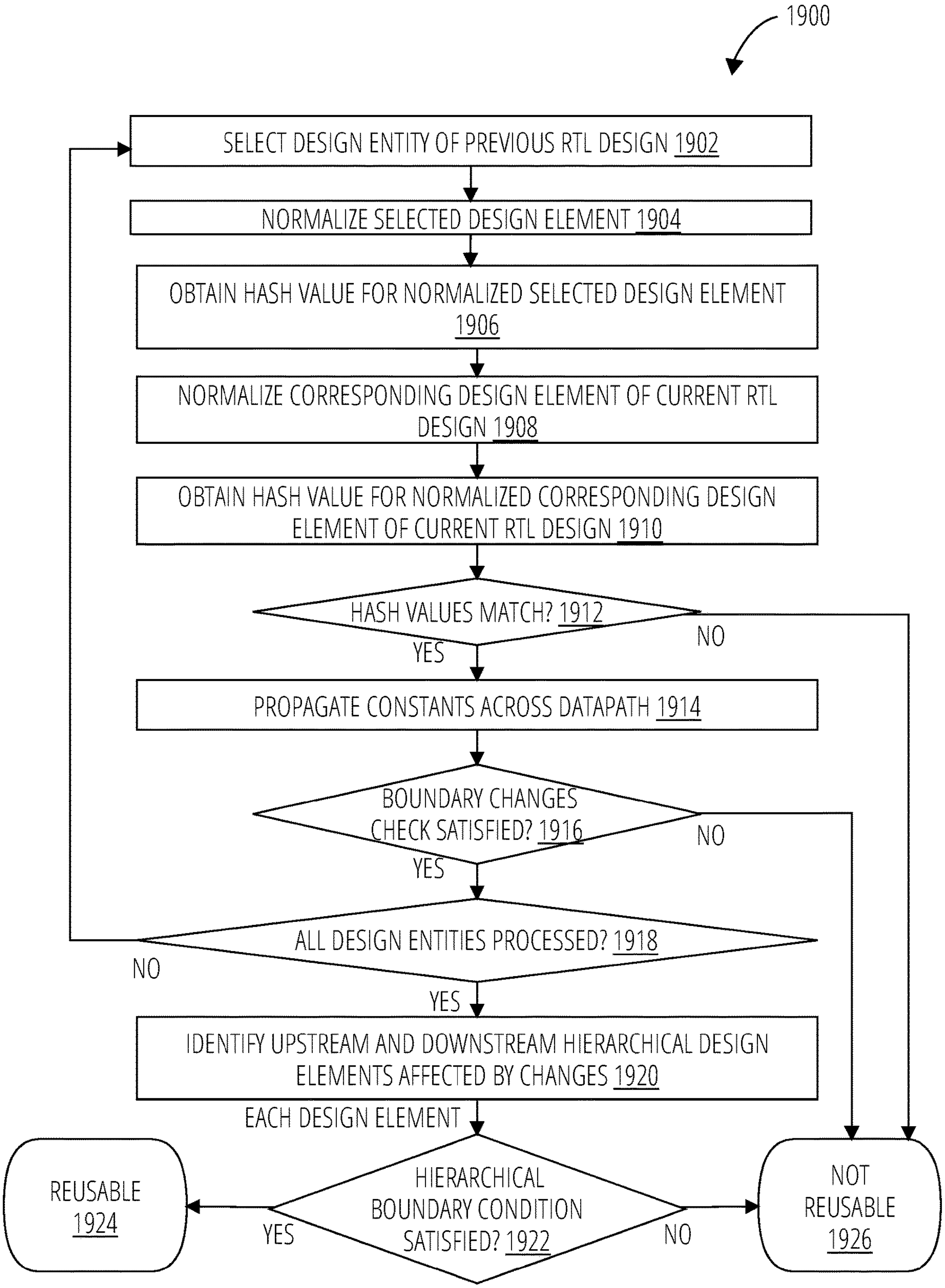
FIG. 19 illustrates a flowchart showing operations of a method for reusability analysis for incremental synthesis, according to some examples.

FIG. 19 shows operations of a method 1900 for reusability analysis for incremental synthesis. Method 1900 may implement the analysis operation 312 in some examples, and the method 1900 is described below with reference to the elements of analysis operation 312 shown in FIG. 4. However, it will be appreciated that other examples may implement the operations of method 1900 using other suitable means.

Although the example method 1900 depicts a particular sequence of operations, the sequence may be altered without departing from the scope of the present disclosure. For example, some of the operations depicted may be performed in parallel or in a different sequence that does not materially affect the function of the method 1900. In other examples, different components of an example device or system that implements the method 1900 may perform functions at substantially the same time or in a specific sequence.

At operation 1902, a design entity of the previous RTL design 302 is selected.

At operation 1904, the selected design entity is normalized. Non-meaningful RTL content may be removed and/or replaced with placeholder data, as described above.

At operation 1906, a hash value is generated for the normalized selected design entity. For example, a checksum may be computed for the normalized design entity.

At operation 1908, the corresponding design entity of the current RTL design 304 is normalized, as at operation 1904.

At operation 1910, a hash value is generated for the normalized corresponding design entity of the current RTL design 304, as at operation 1906.

At decision block 1912, if the hash values match, the method 1900 proceeds to operation 1914; otherwise, the method proceeds to operation 1926. In some examples, operation 1904 through decision block 1912 correspond to content match check 402.

At operation 1914, constants are propagated across the datapath of the selected design entity. A boundary optimization condition is checked (e.g., at boundary change check 404). In some examples, operation 1914 is implemented by method 600 described above with reference to FIG. 6.

At decision block 1916, if the boundary change check 404 is satisfied, the method 1900 proceeds to decision block 1918; otherwise, the method proceeds to operation 1926.

At decision block 1918, if all design entities have been processed (e.g., selected at operation 1902 and processed at operation 1904 through decision block 1916), the method 1900 proceeds to operation 1920; otherwise, the method 1900 returns to operation 1902 to select and process the next design entity.

At operation 1920, upstream and downstream hierarchical design elements affected by changes between the previous and current RTL designs are identified. In some examples, this hierarchical propagation of checks is performed by hierarchical propagation check 406 in accordance with the examples described above with reference to FIG. 7 through FIG. 18.

At decision block 1922, all processed design entities are checked for whether the hierarchical boundary condition is satisfied. For those that do satisfy the hierarchical boundary condition, the method 1900 proceeds to operation 1924; for those that do not satisfy the hierarchical boundary condition, the method 1900 proceeds to operation 1926.

At operation 1924, the processed design entity is deemed to be reusable (e.g., the design entity in the current RTL design 304 can be replaced with its counterpart in the implementation of previous RTL design 306, and the counterpart in the implementation of previous RTL design 306 is identified as a reusable design entity 322).

At operation 1926, the processed design entity is deemed not to be reusable (e.g., the design entity in the current RTL design 304 cannot be replaced with its counterpart in the implementation of previous RTL design 306, and must instead be re-synthesized by the incremental synthesis 408 operation).

Figure 20:
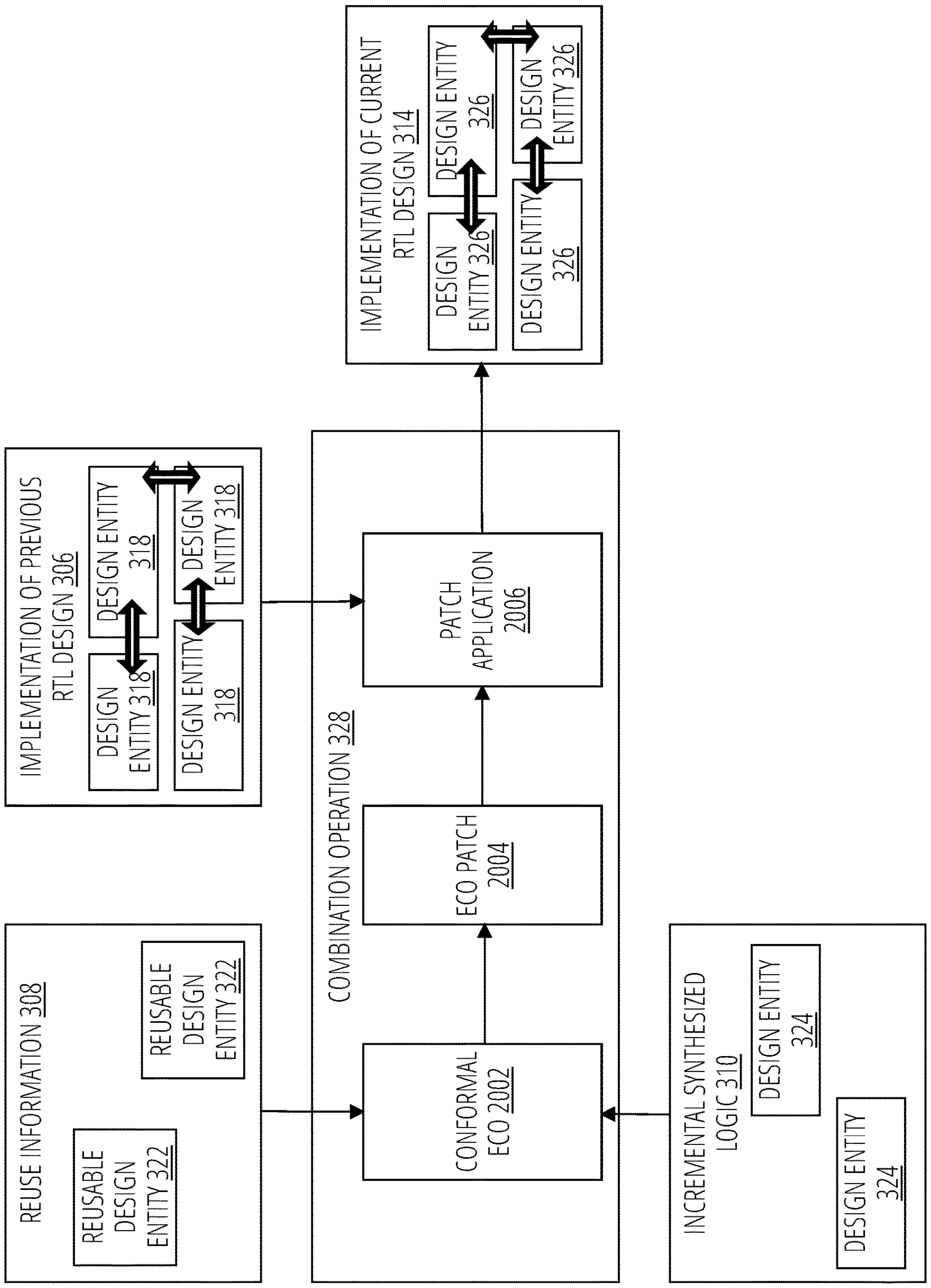
FIG. 20 illustrates a schematic diagram of the operations of the combination module of FIG. 3, according to some examples.

FIG. 20 shows a schematic diagram of sub-operations of an example implementation of the combination operation 328 of FIG. 3. In the illustrated example, the combination operation 328 includes a conformal ECO 2002 operation to apply conformal engineering change order techniques to the reuse information 308 and incremental synthesized logic 310 to generate an ECO patch 2004 defining the changes to be applied to the implementation of previous RTL design 306 (e.g., version N) in order to generate an implementation of current RTL design 314 (e.g., version N+1). The ECO patch 2004 is applied to the implementation of previous RTL design 306 by a patch application 2006 operation, thereby generating the implementation of current RTL design 314. In some examples, the ECO patch 2004 is much smaller than would typically be generated following re-synthesis, because only the changed design entities are incrementally synthesized or re-synthesized.

In other examples, the combination operation 328 is performed without using conformal ECO to generate and apply an ECO patch. Instead, the incremental synthesized logic 310 is synthesized within the context of the reusable design entities 322 from the implementation of previous RTL design 306, and the implementation of current RTL design 314 is assembled from the incremental synthesized logic 310 and reusable design entities 322 without the need to generate and/or apply an ECO patch.

FIG. 21 shows operations of a method 2100 for performing incremental synthesis. Method 2100 may implement the logic synthesis operation 132 in some examples, and the method 2100 is described below with reference to the elements of logic synthesis operation 132 shown in FIG. 3. However, it will be appreciated that other examples may implement the operations of method 2100 using other suitable means.

Although the example method 2100 depicts a particular sequence of operations, the sequence may be altered without departing from the scope of the present disclosure. For example, some of the operations depicted may be performed in parallel or in a different sequence that does not materially affect the function of the method 2100. In other examples, different components of an example device or system that implements the method 2100 may perform functions at substantially the same time or in a specific sequence.

At operation 2102, a current register-transfer level design (e.g., current RTL design 304) is accessed. For example, the current RTL design 304 may include HDL code defining the current RTL design 304, stored in a memory 206 of a machine 200 performing the method 600.

At operation 2104, an implementation of a previous register-transfer level design (e.g., implementation of previous RTL design 306) is accessed. For example, the implementation of previous RTL design 306 may be stored in cache 330.

At operation 2106, the current RTL design 304 and the implementation of previous RTL design 306 are processed (e.g., by analysis operation 312) to generate reuse information 308 identifying one or more reusable design entities 322. The reusable design entities 322 include design entities of the implementation of previous RTL design 306 that can be reused in implementing the current RTL design 304. In some examples, the operations of analysis operation 312 are performed in accordance with the elements of FIG. 4, FIG. 5, method 600 of FIG. 6, and/or with the hierarchical propagation rules of FIG. 7 through FIG. 18.

At operation 2108, the implementation of current RTL design 314 is generated. Operation 2108 includes operations 2110 and 2112.

At operation 2110, the design entities of the current RTL design 304 are processed to generate incremental synthesized logic 310. As described above, only those design entities that cannot be replaced with the implemented design entities of the implementation of previous RTL design 306 need to be re-synthesized by the incremental synthesis 408 operation to generate the incremental synthesized logic 310. Thus, in some examples, the reuse information 308 is also used as an input to operation 2110. The incremental synthesized logic 310 may be synthesized within the context of the implementation of previous RTL design 306; thus, in some examples, the implementation of previous RTL design 306 is provided as a further input to operation 2110.

At operation 2112, the reusable design entities 322 are combined with the incremental synthesized logic 310 based on the reuse information 308 (e.g., by the combination operation 328). In some examples, operation 2112 may include generating and applying an ECO patch 2004, as described above with reference to FIG. 20. In some examples, the combination operation 328 does not include generating and/or applying a patch, such as an ECO patch.

CONCLUSION

Examples described herein may provide methods, systems, and computer readable media for incremental synthesis of design entities of an RTL design of a circuit.

By avoiding the need to re-synthesize and/or to re-implement an entire changed RTL design, some examples may conserve computing resources by shortening and simplifying the logic synthesis operations performed by an EDA system in each iteration of the RTL design, synthesis, and implementation cycle. A design process flow may be shortened, allowing more rapid iteration of design changes and potentially achieving greater performance and/or lower resource consumption in the final product. Shortening the design process flow may avoid wasting resources due to missed production deadlines or otherwise wasted due to process dependencies being halted while waiting for one or more iterations of RTL changes, synthesis, and implementation are completed. Incremental synthesis may provide an accurate prediction of PPA outcomes for a circuit implementation based on a new version of an RTL design. This may allow RTL and incremental synthesis to be performed without the need to re-implement the new design in order to determine the impact of design changes on PPA, further conserving computational resources and/or shortening the iterative design cycle.

Glossary

"Client device" refers, for example, to any machine that interfaces to a communications network to obtain resources from one or more server systems or other client devices. A client device may be, but is not limited to, a mobile phone, desktop computer, laptop, portable digital assistants (PDAs), smartphones, tablets, ultrabooks, netbooks, laptops, multi-processor systems, microprocessor-based or programmable consumer electronics, game consoles, set-top boxes, or any other communication device that a user may use to access a network.

"Communication network" refers, for example, to one or more portions of a network that may be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network or a portion of a network may include a wireless or cellular network, and the coupling may be a Code Division Multiple Access (CDMA) connection, a Global System for Mobile communications (GSM) connection, or other types of cellular or wireless coupling. In this example, the coupling may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth-generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long-range protocols, or other data transfer technology. The term "network", as used herein, shall refer to a communication network unless otherwise indicated.

"Component" refers, for example, to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various examples, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application-specific integrated circuit (ASIC). A hardware component may also include programmable logic or circuitry that is temporarily configured by software to perform certain operations. For example, a hardware component may include software executed by a general-purpose processor or other programmable processors. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering examples in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In examples in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some examples, the processors or processor-implemented components may be located in a single geographic location (e.g., within a home environment, an office environment, or a server farm). In other examples, the processors or processor-implemented components may be distributed across a number of geographic locations.

"Computer-readable storage medium" refers, for example, to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

"Machine storage medium" refers, for example, to a single or multiple storage devices and media (e.g., a centralized or distributed database, and associated caches and servers) that store executable instructions, routines and data. The term shall accordingly be taken to include, but not be limited to, solid-state memories, and optical and magnetic media, including memory internal or external to processors. Specific examples of machine-storage media, computer-storage media and device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Non-transitory computer-readable storage medium" refers, for example, to a tangible medium that is capable of storing, encoding, or carrying the instructions for execution by a machine.

"Signal medium" refers, for example, to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

"User device" refers, for example, to a device accessed, controlled or owned by a user and with which the user interacts perform an action, or an interaction with other users or computer systems.

What is claimed is:

1. A system comprising:

one or more hardware processors; and a computer-readable storage medium storing instructions, which when executed by the one or more processors, cause the system to perform operations comprising:

accessing, by the one or more hardware processors, a current register-transfer level design that comprises a plurality of design entities defined at a register-transfer level;

accessing, by the one or more hardware processors, an implementation of a previous register-transfer level design that comprises a plurality of design entities defined at an implementation level;

processing, by the one or more hardware processors, the current register-transfer level design and the implementation of the previous register-transfer level design to generate reuse information that identifies one or more reusable design entities, the one or more reusable design entities comprising design entities of the implementation of the previous register-transfer level design that can be reused in implementing the current register-transfer level design; and generating, by the one or more hardware processors, an implementation of the current register-transfer level design by:

processing one or more design entities of the current register-transfer level design to generate synthesized logic corresponding to the one or more design entities of the current register-transfer level design; and combining the one or more reusable design entities with the synthesized logic based on the reuse information to generate the implementation of the current register-transfer level design.

2. The system of claim 1, wherein:

combining the one or more reusable design entities with the synthesized logic based on the reuse information comprises:

generating an engineering change order patch based on the reuse information and the synthesized logic using a conformal engineering change order; and applying the engineering change order patch to the implementation of the previous register-transfer level design.

3. The system of claim 1, wherein:

the current register-transfer level design comprises register-transfer level design data comprising hardware description language data.

4. The system of claim 1, wherein:

the reuse information comprises design content match information identifying the one or more reusable design entities as satisfying a content matching condition; and the content matching condition requires that a design entity of the previous register-transfer level design has register-transfer level content matching register-transfer level content of one or more corresponding design entities of the current register-transfer level design.

5. The system of claim 4, wherein:

generating the reuse information comprises:

generating current design content information representative of register-transfer level content of the plurality of design entities of the current register-transfer level design;

obtaining previous design content information representative of register-transfer level content of each design entity of the previous register-transfer level design corresponding to a design entity of the current register-transfer level design;

comparing the current design content information to the previous design content information to generate the design content match information; and selecting the one or more reusable design entities based on the design content match information.

6. The system of claim 5, wherein:

the current design content information comprises a hash value for each design entity of the current register-transfer level design; and the previous design content information comprises a hash value for each design entity of the previous register-transfer level design.

7. The system of claim 6, wherein:

a hash value for an individual design entity of at least one of the current register-transfer level design or the previous register-transfer level design is generated by:

obtaining register-transfer level entity data representative of the individual design entity;

normalizing non-register-transfer level content of the register-transfer level entity data representative of the individual design entity to generate a normalized representation of the design entity; and generating the hash value based on the normalized representation of the individual design entity.

8. The system of claim 5, wherein:

the reuse information further comprises boundary optimization information identifying one or more boundary changes between the previous register-transfer level design and the current register-transfer level design.

9. The system of claim 8, wherein:

the reuse information further comprises hierarchy information representative of one or more parent-child relationships between the design entities of the previous register-transfer level design.

10. The system of claim 9, wherein:

selecting the one or more reusable design entities further comprises:

processing the boundary optimization information to determine that the one or more reusable design entities satisfy a boundary optimization condition.

11. The system of claim 10, wherein:

a design entity satisfies the boundary optimization condition if the design entity has no boundary changes that are any of the following: a Boolean satisfiability change across a boundary of the design entity, a binary decision diagram change across a boundary of the design entity, or a push feedthrough change outside the design entity.

12. The system of claim 11, wherein:

selecting the one or more reusable design entities further comprises:

processing the boundary optimization information and the hierarchy information to determine that the one or more reusable design entities satisfy a hierarchical boundary condition, wherein:

the hierarchical boundary condition requires that any children of a design entity either satisfy the content matching condition or satisfy the boundary optimization condition.

13. The system of claim 12, wherein:

the hierarchical boundary condition further requires that a design entity have no child that fails to satisfy the hierarchical boundary condition and also fails to satisfy the boundary optimization condition.

14. The system of claim 13, wherein:

selecting the one or more reusable design entities further comprises:

treating any design entity with re-timing enabled as failing to satisfy the content matching condition and failing to satisfy the boundary optimization condition.

15. A method comprising:

accessing, by one or more hardware processors, a current register-transfer level design that comprises a plurality of design entities defined at a register-transfer level;

accessing, by the one or more hardware processors, an implementation of a previous register-transfer level design that comprises a plurality of design entities defined at an implementation level;

processing, by the one or more hardware processors, the current register-transfer level design and the implementation of the previous register-transfer level design to generate reuse information that identifies one or more reusable design entities, the one or more reusable design entities comprising design entities of the implementation of the previous register-transfer level design that can be reused in implementing the current register-transfer level design; and generating, by the one or more hardware processors, an implementation of the current register-transfer level design by:

processing one or more design entities of the current register-transfer level design to generate synthesized logic corresponding to the one or more design entities of the current register-transfer level design; and combining the one or more reusable design entities with the synthesized logic based on the reuse information to generate the implementation of the current register-transfer level design.

16. The method of claim 15, wherein:

the reuse information comprises design content match information identifying the one or more reusable design entities as satisfying a content matching condition; and the content matching condition requires that a design entity of the previous register-transfer level design has register-transfer level content matching register-transfer level content of one or more corresponding design entities of the current register-transfer level design.

17. The method of claim 16, wherein:

generating the reuse information comprises:

generating current design content information representative of register-transfer level content of the plurality of design entities of the current register-transfer level design;

obtaining previous design content information representative of register-transfer level content of each design entity of the previous register-transfer level design corresponding to a design entity of the current register-transfer level design;

comparing the current design content information to the previous design content information to generate the design content match information; and selecting the one or more reusable design entities based on the design content match information.

18. The method of claim 17, wherein:

the reuse information further comprises boundary optimization information identifying one or more boundary changes between the previous register-transfer level design and the current register-transfer level design; and selecting the one or more reusable design entities further comprises:

processing the boundary optimization information to determine that the one or more reusable design entities satisfy a boundary optimization condition.

19. The method of claim 18, wherein:

the reuse information further comprises hierarchy information representative of one or more parent-child relationships between the design entities of the previous register-transfer level design; and selecting the one or more reusable design entities further comprises:

processing the boundary optimization information and the hierarchy information to determine that the one or more reusable design entities satisfy a hierarchical boundary condition, wherein:

the hierarchical boundary condition requires that any children of a design entity either satisfy the content matching condition or satisfy the boundary optimization condition.

20. A non-transitory computer-readable storage medium, the computer-readable storage medium comprising instructions that when executed by one or more hardware processors of a system, cause the system to perform operations comprising:

accessing, by the one or more hardware processors, a current register-transfer level design that comprises a plurality of design entities defined at a register-transfer level;

accessing, by the one or more hardware processors, an implementation of a previous register-transfer level design that comprises a plurality of design entities defined at an implementation level;

processing, by the one or more hardware processors, the current register-transfer level design and the implementation of the previous register-transfer level design to generate reuse information that identifies one or more reusable design entities, the one or more reusable design entities comprising design entities of the implementation of the previous register-transfer level design that can be reused in implementing the current register-transfer level design; and generating, by the one or more hardware processors, an implementation of the current register-transfer level design by:

processing one or more design entities of the current register-transfer level design to generate synthesized logic corresponding to the one or more design entities of the current register-transfer level design; and combining the one or more reusable design entities with the synthesized logic based on the reuse information to generate the implementation of the current register-transfer level design.

* * * * *